(12) United States Patent
Shimizu et al.

(10) Patent No.: US 9,973,070 B2
(45) Date of Patent: May 15, 2018

(54) ELECTRIC POWER CONVERTER

(71) Applicant: DENSO CORPORATION, Kariya, Aichi-pref. (JP)

(72) Inventors: Hiroshi Shimizu, Nagoya (JP); Naoki Hirasawa, Okazaki (JP)

(73) Assignee: DENSO CORPORATION, Kariya (JP)

( * ) Notice: Subject to any disclaimer, the term of this patent is extended or adjusted under 35 U.S.C. 154(b) by 658 days.

(21) Appl. No.: 14/044,121

(22) Filed: Oct. 2, 2013

(65) Prior Publication Data

US 2014/0092663 A1   Apr. 3, 2014

(30) Foreign Application Priority Data

Oct. 2, 2012  (JP) .................................. 2012-220238
Aug. 19, 2013 (JP) .................................. 2013-169392

(51) Int. Cl.
| | | |
|---|---|---|
| H05K 7/00 | (2006.01) | |
| H02M 1/00 | (2006.01) | |
| H05K 7/20 | (2006.01) | |
| H02M 7/00 | (2006.01) | |

(52) U.S. Cl.
CPC .............. *H02M 1/00* (2013.01); *H02M 7/003* (2013.01); *H05K 7/2089* (2013.01); *H05K 7/20927* (2013.01); *H01L 2924/0002* (2013.01); *H02M 2001/007* (2013.01)

(58) Field of Classification Search
CPC ...... H02M 7/003; H02M 1/00; H05K 7/2089; H05K 7/023
See application file for complete search history.

(56) References Cited

U.S. PATENT DOCUMENTS

| | | | | |
|---|---|---|---|---|
| 7,724,523 | B2* | 5/2010 | Ishiyama ............. | H01L 25/072 361/689 |
| 7,745,952 | B2* | 6/2010 | Nakatsu ................. | B60L 11/08 257/706 |
| 8,693,193 | B2* | 4/2014 | Ishibashi .............. | H02M 7/003 361/688 |
| 9,196,880 | B2* | 11/2015 | Kim .................... | H01M 2/1022 |

(Continued)

FOREIGN PATENT DOCUMENTS

| | | |
|---|---|---|
| JP | 2005-072147 | 3/2005 |
| JP | 2006-210605 | 8/2006 |

(Continued)

OTHER PUBLICATIONS

Office Action (3 pages) dated Jan. 6, 2015, issued in corresponding Japanese Application No. 2013-169392 and English translation (5 pages).

*Primary Examiner* — Robert J Hoffberg
*Assistant Examiner* — Hung Dang
(74) *Attorney, Agent, or Firm* — Nixon & Vanderhye P.C.

(57) ABSTRACT

An electric power converter includes a stacked body in which a plurality of semiconductor modules and a plurality of coolers are stacked. Each of the semiconductor modules is provided with a main body that has semiconductor elements therein, a plurality of power terminals, and control terminals. Among the plurality of the power terminals respectively included in the two semiconductor modules adjoining in a stacking direction of the stacked body, at least parts of the power terminals are configured so as not to overlap each other when viewed from the stacking direction.

18 Claims, 23 Drawing Sheets

(56) References Cited

U.S. PATENT DOCUMENTS

| | | | |
|---|---|---|---|
| 2012/0008280 A1 | 1/2012 | Tokuyama et al. | |
| 2014/0119087 A1* | 5/2014 | Matsuoka | H02M 7/003 363/132 |
| 2016/0254206 A1* | 9/2016 | Ohno | H01L 23/31 |

FOREIGN PATENT DOCUMENTS

| | | |
|---|---|---|
| JP | 2007-299781 | 11/2007 |
| JP | 2012-100457 | 5/2012 |

\* cited by examiner

ELECTRIC POWER CONVERTER

CROSS-REFERENCE TO RELATED APPLICATION

The application is based on and claims the benefit of priority from earlier Japanese Patent Applications No. 2012-220238 filed Oct. 2, 2012, and No. 2013-169392 filed Aug. 19, 2013, the descriptions of which are incorporated herein by reference.

TECHNICAL FIELD

The present disclosure relates to an electric power converter that has a plurality of semiconductor modules with semiconductor elements therein.

BACKGROUND

For example, as an electric power converter that performs power conversion between DC power and AC power, a device that stacks a plurality of semiconductor modules with semiconductor elements therein and coolers for cooling the semiconductor modules is known (refer to Japanese Patent Application Laid-Open Publication No. 2007-299781).

Each semiconductor module has a main body with the semiconductor elements therein, and control terminals and power terminals projecting from the main body.

There are input terminals to which a DC voltage is applied and output terminals for outputting an AC voltage in the power terminals.

The control terminals are connected to a control circuit board.

The DC voltage applied to the input terminals is converted into the AC voltage and outputted from the output terminals by switch-operating the semiconductor modules by the control circuit board.

When assembling the electric power converter, the plurality of semiconductor modules and the plurality of coolers are stacked, and bus bars and connectors are connected to the power terminals.

Then, the connectors or the like are electrically connected to other electronic components.

However, in the electric power converter disclosed in the document '781 mentioned above, spaces between the power terminals of the two semiconductor modules adjoining in the stacking direction are narrow.

Therefore, there is a problem that it is difficult to connect the power terminals and the connectors.

That is, for example, when connecting the power terminals and the connectors, connector terminals are inserted between two power terminals adjoining in the stacking direction, and their principal surfaces are contacted.

Then the principal surfaces are welded or fastened by bolts and nuts.

However, if the spaces between two power terminals in the stacking direction are narrow, it is difficult to insert the connector terminals in these spaces, and it is also difficult to connect the power terminals and the connector terminals.

SUMMARY

An embodiment provides an electric power converter whose power terminals can be connected easily to bus bars or connectors.

In an electric power converter according to a first aspect, the electric power converter includes a stacked body in which a plurality of semiconductor modules having semiconductor elements therein and a plurality of coolers that cool the semiconductor modules are stacked.

Each of the semiconductor modules is provided with a main body that has the semiconductor elements therein, a plurality of power terminals projecting from the main body, and control terminals that are connected electrically to a control circuit.

Each of the main bodies overlaps, and among the plurality of the power terminals respectively included in each two semiconductor modules adjoining in a stacking direction of the stacked body, at least parts of the power terminals are configured so as not to overlap each other when viewed from the stacking direction.

In the electric power converter, among the plurality of the power terminals respectively included in the two semiconductor modules adjoining in the stacking direction, at least parts of the power terminals are configured so as not to overlap each other when viewed from the stacking direction.

Therefore, spaces between the power terminals of the two semiconductor modules adjoining in the stacking direction can be prevented from being narrowed and it becomes possible to easily perform a process of connecting the power terminals to connectors or the like.

In the electric power converter, each of the main bodies overlaps when viewed from the stacking direction.

Therefore, the semiconductor modules can be stably stacked, and the stacked body can be prevented from becoming loose.

According to the present disclosure, the electric power converter whose power terminals can be connected easily to the connectors or the like can be provided.

In the electric power converter according to a second aspect, the main body is formed in a quadrilateral-plate shape, the power terminals includes input terminals to which a DC voltage is applied, and output terminals that are electrically connected to AC loads.

The output terminals are projected from an output side surface, which is one of four side surfaces of the main body, the input terminals are projected from an input side surface, which is the side surface different from the output side surface, the output terminals are disposed between a center in a longitudinal direction of the output side surface and an end portion in the longitudinal direction of the output side surface.

The output terminals are projecting in the same direction from the plurality of the semiconductor modules, and each of the semiconductor modules is disposed so that the output terminals of the two semiconductor module adjoining in the stacking direction do not overlap each other when viewed from the stacking direction.

In the electric power converter according to a third aspect, the plurality of semiconductor modules are formed in the same shape, and among the two semiconductor modules adjoining in the stacking direction, one of the semiconductor modules is disposed in a state of front and back surfaces thereof being reversed relative to the other semiconductor module.

In the electric power converter according to a fourth aspect, the input side surface is parallel to the output side surface.

In the electric power converter according to a fifth aspect, the input terminals are disposed between a center in the longitudinal direction of the input side surface and an end portion in the longitudinal direction of the input side surface.

In the electric power converter according to a sixth aspect, the input terminal is orthogonal to the output terminal.

In the electric power converter according to a seventh aspect, the control terminals are projected from the output side surface, and the control terminals are disposed between a center in the longitudinal direction of the output side surface and an end portion in the longitudinal direction of the output side surface.

In the electric power converter according to an eighth aspect, when viewed from the stacking direction, the output terminals of one of the semiconductor modules among the two semiconductor modules and the control terminals of another one of the two semiconductor modules overlap each other, and the length of the output terminal in a projecting direction is longer than the length of the control terminal in the projecting direction of the output terminals.

In the electric power converter according to a ninth aspect, the control circuit is formed on a control circuit board, through-holes are formed on the control circuit board, the control circuit board is connected to the control terminals in a state where the output terminal are inserted through the through holes, and a principal surface of the control circuit board is orthogonal to the projecting direction of the output terminals.

In the electric power converter according to a tenth aspect, a current sensor for measuring a current flowing through the output terminal is provided to the control circuit board.

In the electric power converter according to an eleventh aspect, each of the semiconductor modules has three output terminals, the three output terminals are aligned in the longitudinal direction, the one of the semiconductor modules has a farthest output terminal which is the most farthest from the center of the output side surface in the longitudinal direction and an adjoining output terminal located next to the farthest output terminal, and the current sensor is attached to at least one of either the farthest output terminal or the adjoining output terminal among the three output terminals.

In the electric power converter according to a twelfth aspect, the semiconductor elements include upper arm semiconductor elements and lower arm semiconductor elements connected in series to each other, the power terminals include positive terminals connected to a positive electrode of a capacitor, negative terminals connected to a negative electrode of the capacitor, and intermediate terminals connected between the upper arm semiconductor elements and the lower arm semiconductor elements.

When viewed from the stacking direction of the stacked body, the intermediate terminals of the two semiconductor modules adjoining in the stacking direction do not overlap with each other, and the positive terminals and the negative terminals are respectively overlap each other.

In the electric power converter according to a thirteenth aspect, the plurality of semiconductor modules are formed in the same shape, and among the two semiconductor modules adjoining in the stacking direction, one of the semiconductor modules is disposed in a state of front and back surfaces thereof being reversed relative to the other semiconductor module.

In the electric power converter according to a fourteenth aspect, all of the power terminals are projected from one of the side surfaces of the main body formed in a quadrilateral-plate shape, and the semiconductor module has three intermediate terminals, two positive terminals, and two negative terminals as the power terminals.

Three non-projection regions where no power terminal projects are formed in the one of the side surfaces, the intermediate terminal and the non-projection regions are formed at positions symmetrical with respect to the center in the longitudinal direction of the one of the side surface, and the two positive terminals and the two negative terminal are formed at positions symmetrical with respect to the center.

DETAILED DESCRIPTION OF THE PREFERRED EMBODIMENTS

First Embodiment

With reference to the accompanying drawings, hereinafter will be described embodiments of the present disclosure.

Figure 1:
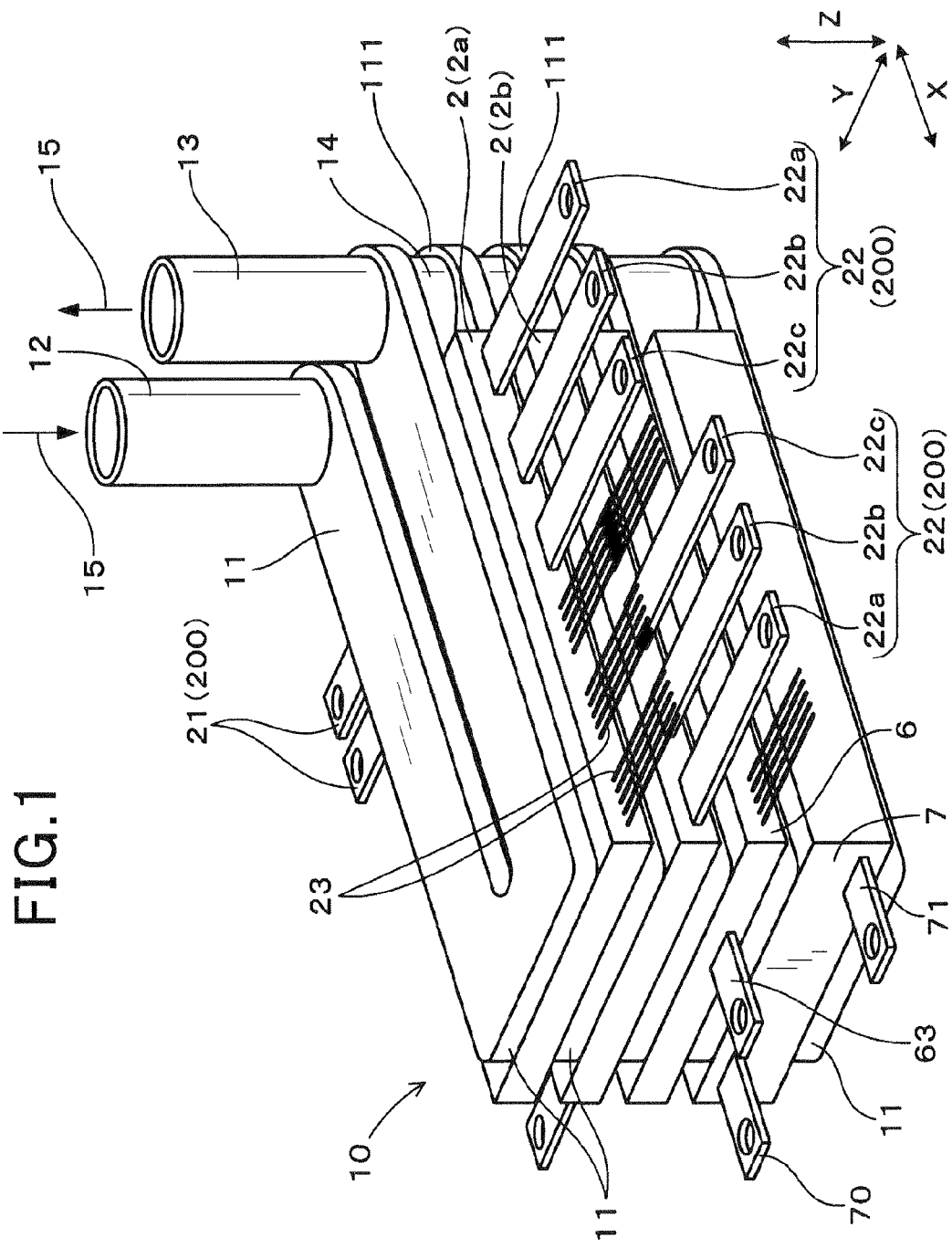
FIG. 1 shows a partial perspective view of an electric power converter in a first embodiment.
Figure 2:
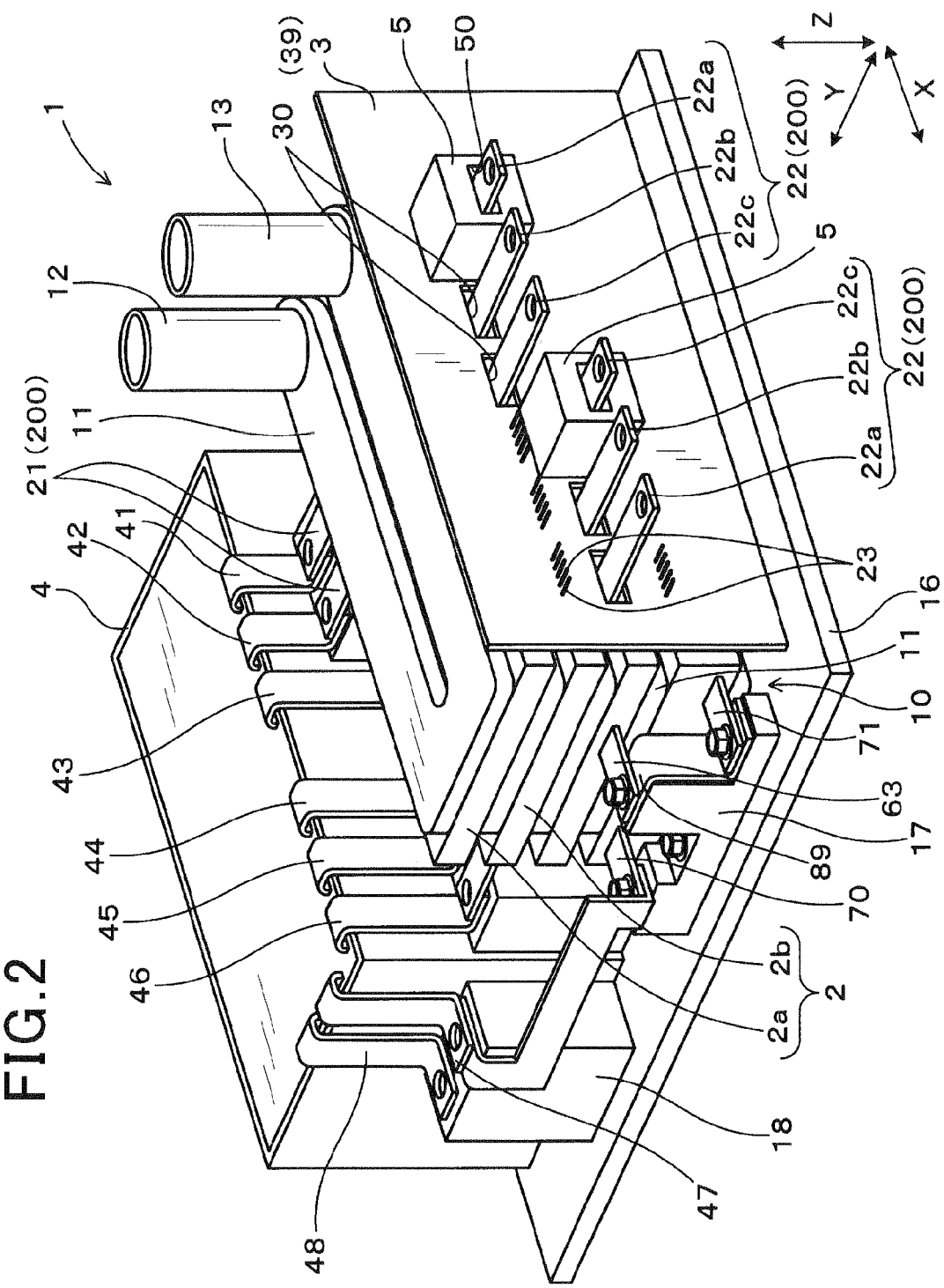
FIG. 2 shows an overall perspective view of the electric power converter in the first embodiment.

As shown FIG. 1 and FIG. 2, an electric power converter 1 of the present embodiment includes a stacked body 10 in which a plurality of semiconductor modules 2 and a plurality of coolers 11 that cool the semiconductor modules 2 are stacked.

Figure 3:
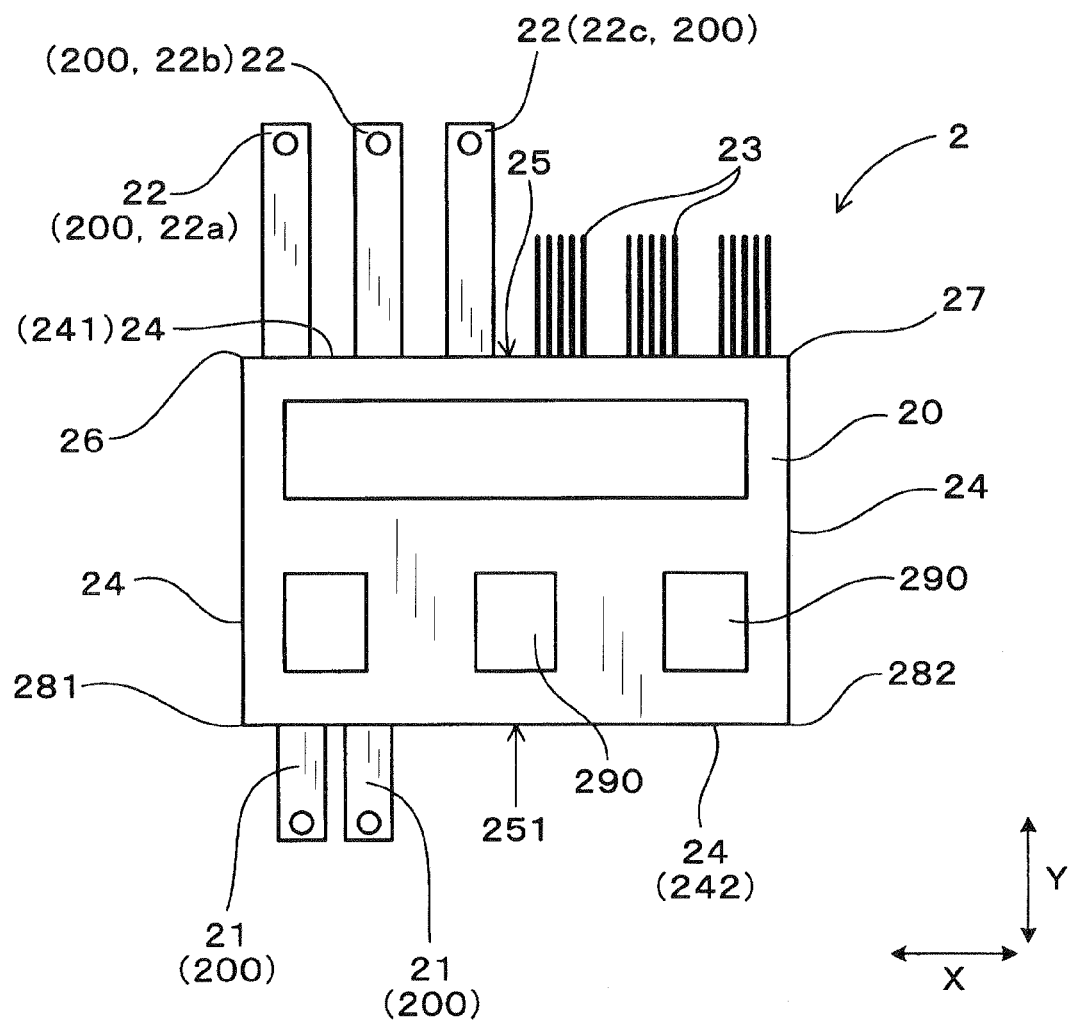
FIG. 3 shows a plan view of a semiconductor module in the first embodiment.

As shown in FIG. 3, each of the semiconductor modules 2 is provided with a main body 20 that has semiconductor elements 29 therein (refer to FIG. 10), a plurality of power terminals 200 projecting from the main body 20, and control terminals 23 that are connected electrically to a control circuit 39 (refer to FIG. 2).

The control circuit 39 is formed on a control circuit board 3.

Figure 6:
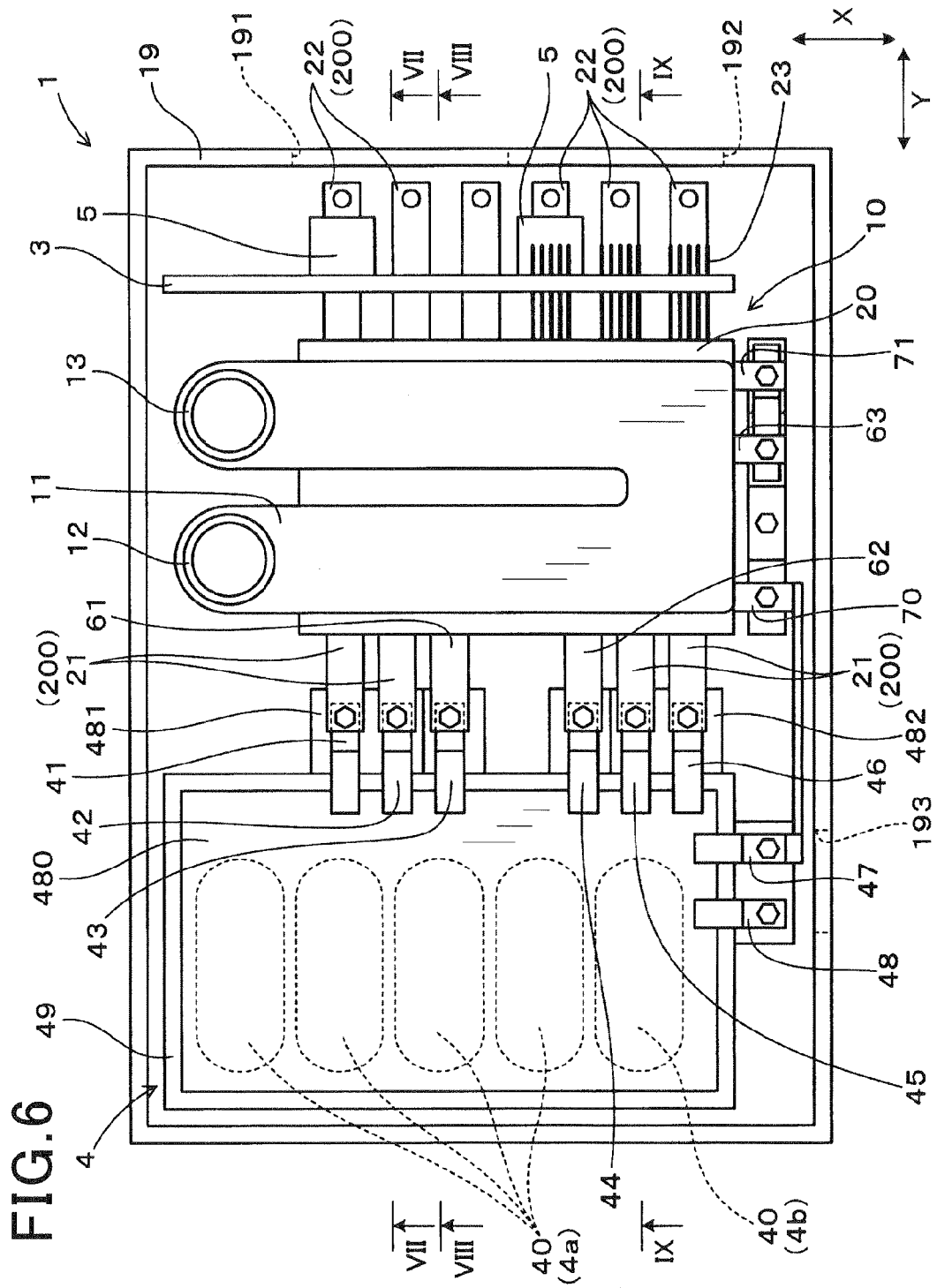
FIG. 6 shows a cross-sectional view of the electric power converter in the first embodiment.

As shown in FIG. 6, when viewed from a stacking direction (hereafter, Z direction) of the stacked body 10, each of the main bodies 20 overlaps.

Further, among the plurality of the power terminals 200 respectively included in the two semiconductor modules 2 adjoining in the Z direction, at least parts of the power terminals 200 are configured so as not to overlap each other when viewed from the Z direction.

As shown in FIG. 3, the main body 20 is formed in a quadrilateral-plate shape.

Figure 10:
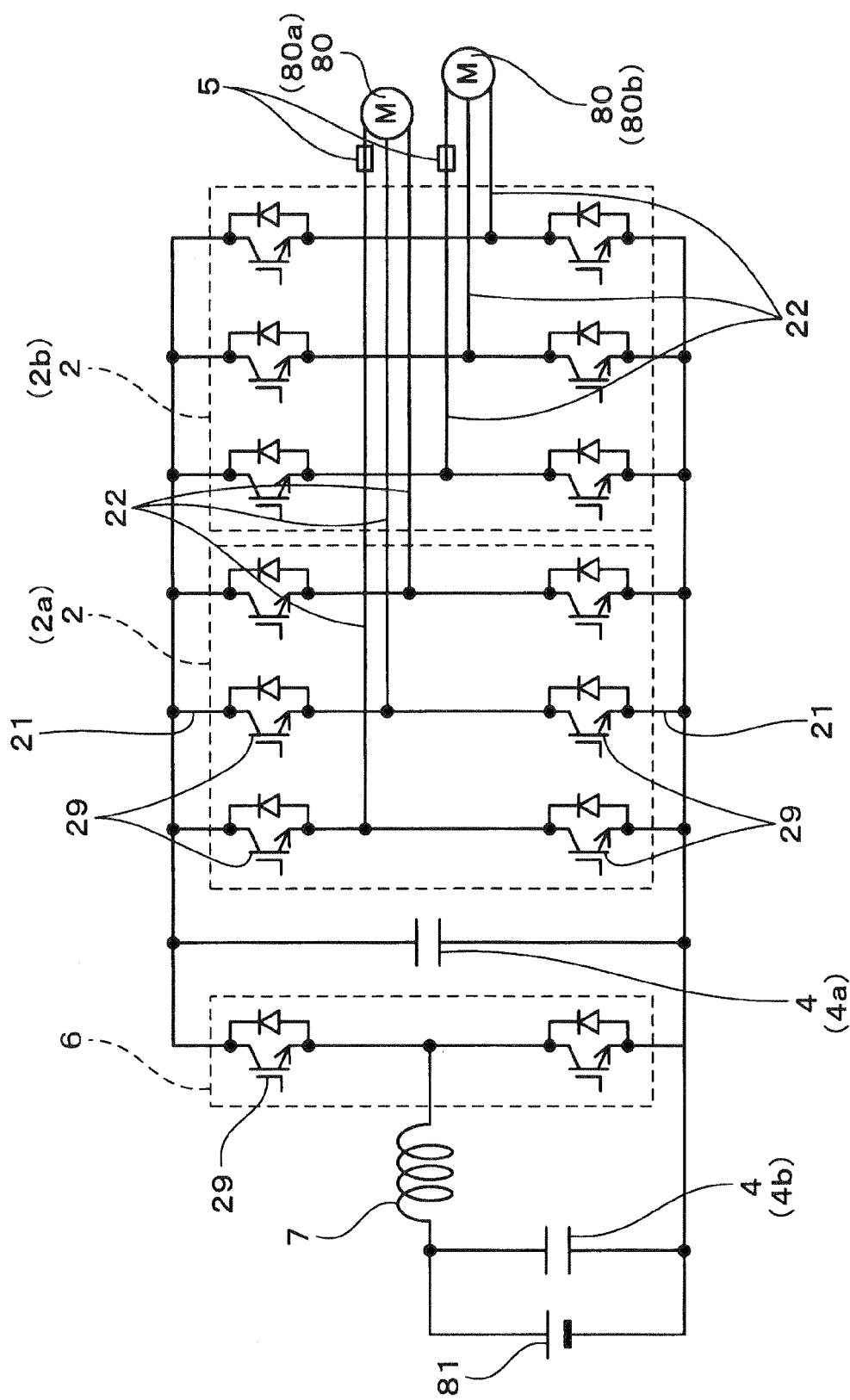
FIG. 10 shows a circuit diagram of the electric power converter in the first embodiment.

The power terminals 200 includes input terminals 21 to which a DC voltage is applied, and output terminals 22 that are electrically connected to AC loads 80 (refer to FIG. 10).

The output terminals 22 are projected from an output side surface 241, which is one of four side surfaces 24 of the main body 20.

Further, the input terminals 21 are projected from an input side surface 242, which is the side surface 24 different from the output side surface 241.

The output terminals 22 are disposed between a center 25 in a longitudinal direction (hereafter, X direction) of the output side surface 241 and an end portion 26 in the X direction of the output side surface 241.

As shown in FIG. 1, the output terminals 22 are projecting in the same direction from the plurality of the semiconductor modules 2.

As shown in FIG. 6, each of the semiconductor modules 2 is disposed so that, each of the main bodies 20 overlaps, and the output terminals 22 of the two semiconductor module 2 adjoining in the Z direction do not overlap each other when viewed from the Z direction.

As shown in FIG. 1, the plurality of the semiconductor modules 2 is formed in the same shape.

Among the two semiconductor modules 2 adjoining in the Z direction, one of the semiconductor modules 2a is disposed in a state of the front and back surfaces thereof being reversed relative to the other semiconductor module 2b.

The electric power converter 1 of the present embodiment is an inverter for a vehicle. As shown in FIG. 1, the two semiconductor modules 2, a booster module 6, a reactor 7, and the coolers 11 are stacked in the present embodiment.

In addition, it is configured that the semiconductor modules 2, the booster module 6, and the reactor 7 are respectively cooled by using the coolers 11.

As shown in FIG. 10, each of the semiconductor modules 2 has six semiconductor elements 29 (IGBT element) therein.

A three-phase bridge circuit is configured by this six semiconductor elements 29.

Further, the two semiconductor elements 29 are provided in the booster module 6.

In the present embodiment, a DC voltage of a DC power supply 81 is boosted by using the booster module 6 and the reactor 7.

Then, the boosted DC voltage is smoothed by smoothing capacitors 4a, and the DC voltage is converted into the three-phase AC voltage by on and off operations of the semiconductor elements 29.

The three-phase AC voltage is output from the three output terminals 22 of the semiconductor module 2.

In the present embodiment, the AC loads 80 (three-phase AC motors) are driven by using the three-phase AC voltage, thereby driving the vehicle.

Two AC loads 80 (80a, 80b) are driven in the present embodiment.

Each on the two semiconductor modules 2 is connected to the separate AC load 80 respectively.

As shown in FIG. 2, a capacitor 4 is provided to one side of the stacked body 10, the side opposite to the projecting side of the output terminals 22.

The smoothing capacitors 4a described above and a filter capacitor 4b (refer to FIG. 10) for removing noise are disposed in the capacitor 4.

Further, as shown in FIG. 2, the control circuit board 3 is provided at a position adjacent to the stacked body 10.

A plurality of through-holes 30 is formed on the control circuit board 3.

The output terminals 22 are inserted through the through holes 30, and the control terminals 23 are connected to the control circuit board 3.

A principal surface of the control circuit board 3 is orthogonal to a projecting direction of the output terminals 22 (hereafter, Y direction).

The control circuit board 3 controls the switching operation of the semiconductor elements 29. Current sensors 5 are attached to the control circuit board 3.

With the current sensors 5, currents flowing through the output terminals 22 are measured, and are utilized for controlling the operation of the electric power converter 1.

Sensor holes 50 are formed in the current sensors 5, and the output terminals 22 are inserted into the sensor holes 50.

Meanwhile, as shown in FIG. 3, the semiconductor modules 2 of the present embodiment are provided with the control terminals 23 and the input terminals 21.

Input terminals 21 are projected from a side surface (input side surface 242) that is parallel to the output side surface 241 among the four side surfaces 24 of the main body 20.

Each of two input terminals 21 is connected to the smoothing capacitor 4a, respectively.

The input terminals 21 are disposed between a center 251 in the longitudinal direction (X direction) of the input side surface 242 and an end portion 281 in the X direction of the input side surface 242.

The length of the input terminal 21 in the Y direction is shorter than the length of the output terminal 22 in the Y direction.

In addition, the control terminals 23 are projected from the output side surface 241.

The control terminals 23 are disposed between the center 25 of the output side surface 241 and another end portion 27 in the X direction.

The main body 20 has a rectangular-plate-like shape.

The output side surface 241 and the input side surface 242 are the side surfaces including long sides of the main body 20.

Further, heat sinks 290 are disposed on a principal surface of the main body 20.

In the present embodiment, the principal surface of the main body 20 is defined as a surface having the largest among the six surfaces of the main body 20, and the side surface is defined as a surface other than the principal surface.

Figure 4:
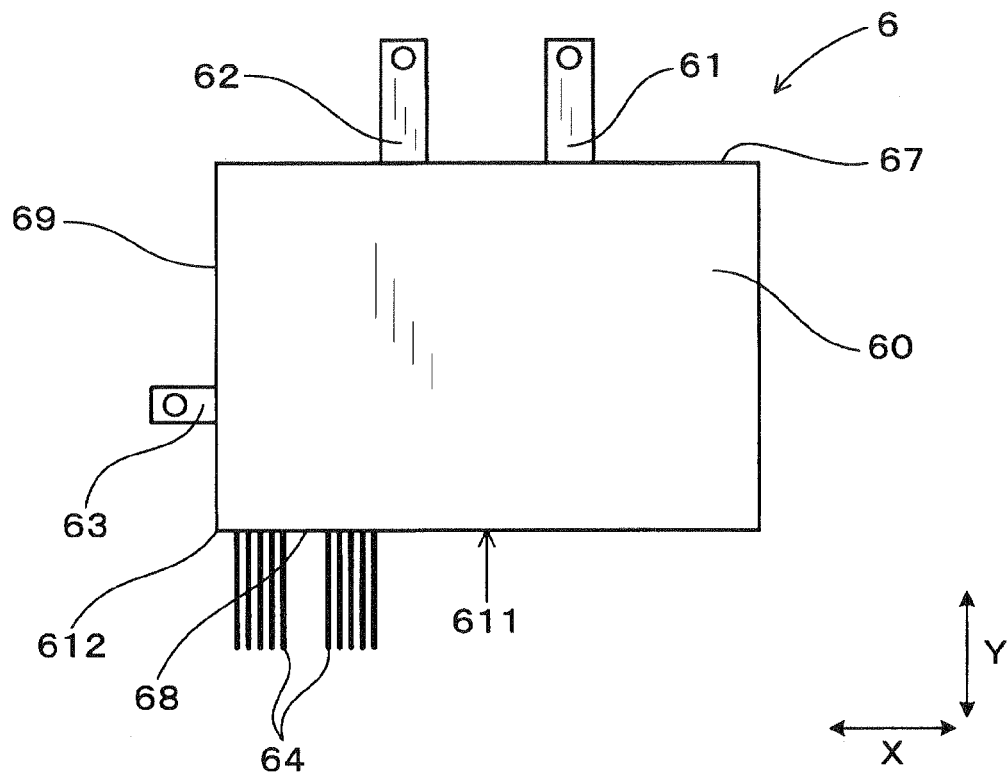
FIG. 4 shows a plan view of a booster module in the first embodiment.

As shown in FIG. 4, the boosting module 6 of the present embodiment is provided with a main body 60 having a rectangular-plate-like shape, a reactor connecting terminal 63, a positive terminal 61, a negative terminal 62, and control terminals 64.

The positive terminal 61 and the negative terminal 62 are projected from a first side surface 67 that includes a long side of the main body 60.

These two terminals 61 and 62 are provided on substantially a center of the first side surface 67 in the X direction.

The control terminals 64 are projected from a second side surface 68 that is parallel to the first side 67 among the four sides of the main body 60.

The control terminals 64 are disposed between a center 611 in the X direction of the second side surface 68 and an end portion 612 in the X direction of the second side surface 68.

The control terminals 64 are connected to the control circuit board 3 mentioned above.

Further, the reactor connecting terminal 63 is disposed on a third side surface 69 that is perpendicular to the first side surface 67 among the four sides of the main body 60.

The reactor connecting terminal 63 is disposed at a position closer to the second side surface 68 in a projecting direction of the control terminals 64 (Y direction).

Figure 5:
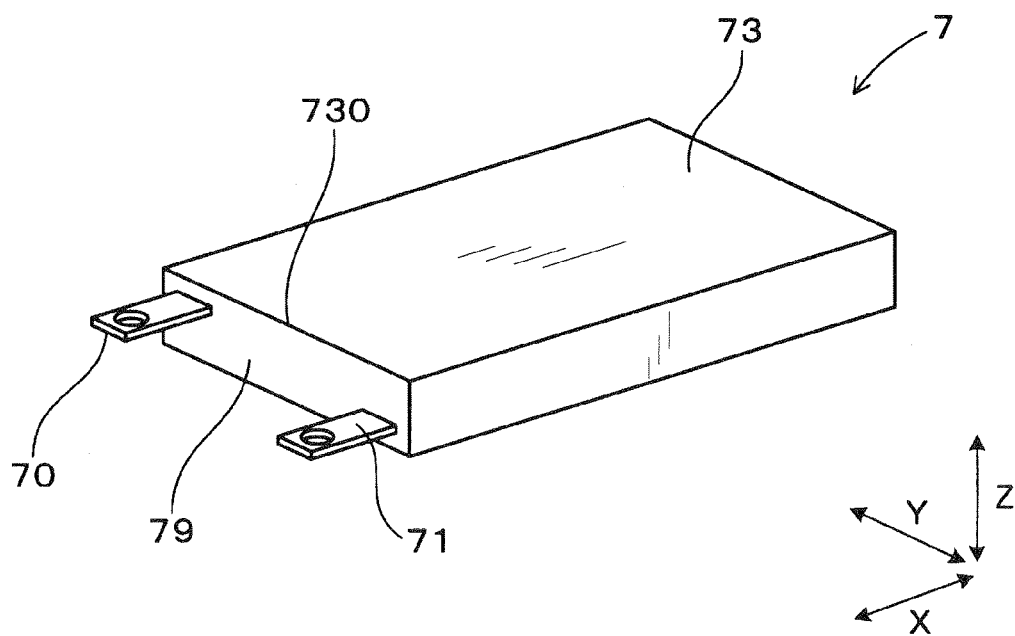
FIG. 5 shows a perspective view of a reactor in the first embodiment.

Meanwhile, as shown in FIG. 5, the reactor 7 is provided with a main body 73 having a rectangular-plate-like shape, and two terminals 70 and 71.

Two terminals 70 and 71 are extended in the X direction from a side surface 79 that includes a short side 730 of the main body 73.

As shown in FIG. 1, the stacked body 10 is formed by stacking the reactor 7, the boosting module 6, the two semiconductor modules 2, and the coolers 11 in the present embodiment.

The terminal 70 and 71 of the reactor 7 and the reactor connecting terminal 63 of the boosting module 6 are respectively projected the same direction (X direction).

As shown in FIG. 2, one of the terminals 71 of the reactor 7 and the reactor connecting terminal 63 are electrically connected by a connecting member 89.

The other one of the terminals 70 of the reactor 7 is electrically connected to a positive input terminal 47 of the capacitor 4.

Further, as shown in FIG. 1, the coolers 11 are tubes formed in a U-shape.

Refrigerant passages where a refrigerant 15 flows are formed insides the coolers 11.

The plurality of the coolers 11 is connected by connecting portions 14 at distal end portions 111 of the coolers 11.

An inlet pipe 12 for introducing the refrigerant 15 and the outlet pipe 13 for discharging the coolant 15 are attached to the coolers 11.

When the refrigerant 15 is introduced from the inlet pipe 12, the refrigerant 15 flows within all of the coolers 11 through the connecting portions 14, and is discharged from the outlet pipe 13.

As a result, the semiconductor modules 2, the boosting module 6, and the reactor 7 are cooled.

As shown FIG. 1 and FIG. 6, when viewed from the Z direction, the output terminals 22 and the control terminals 23 of the two semiconductor modules 2 overlap each other in the present embodiment.

The length of the output terminal 22 in the Y direction is longer than the length of the control terminal 23 in the Y direction.

Further, as shown in FIG. 2 and FIG. 6, the three output terminals 22 projecting from each semiconductor modules 2 are aligned in the X direction.

There is a farthest output terminal 22a which is the most farthest from the center 25 (FIG. 3), and an adjoining output terminal 22b located next to the farthest output terminal 22a, and a closest output terminal 22c which is the most closest to the center 25 in the output terminals 22.

In the present embodiment, among the two semiconductor modules 2a, 2b, the current sensor 5 is attached to the farthest output terminal 22a of one of the semiconductor modules 2a.

Then, the other current sensor 5 is attached to the closest output terminal 22c of the other one of the semiconductor modules 2b.

Figure 7:
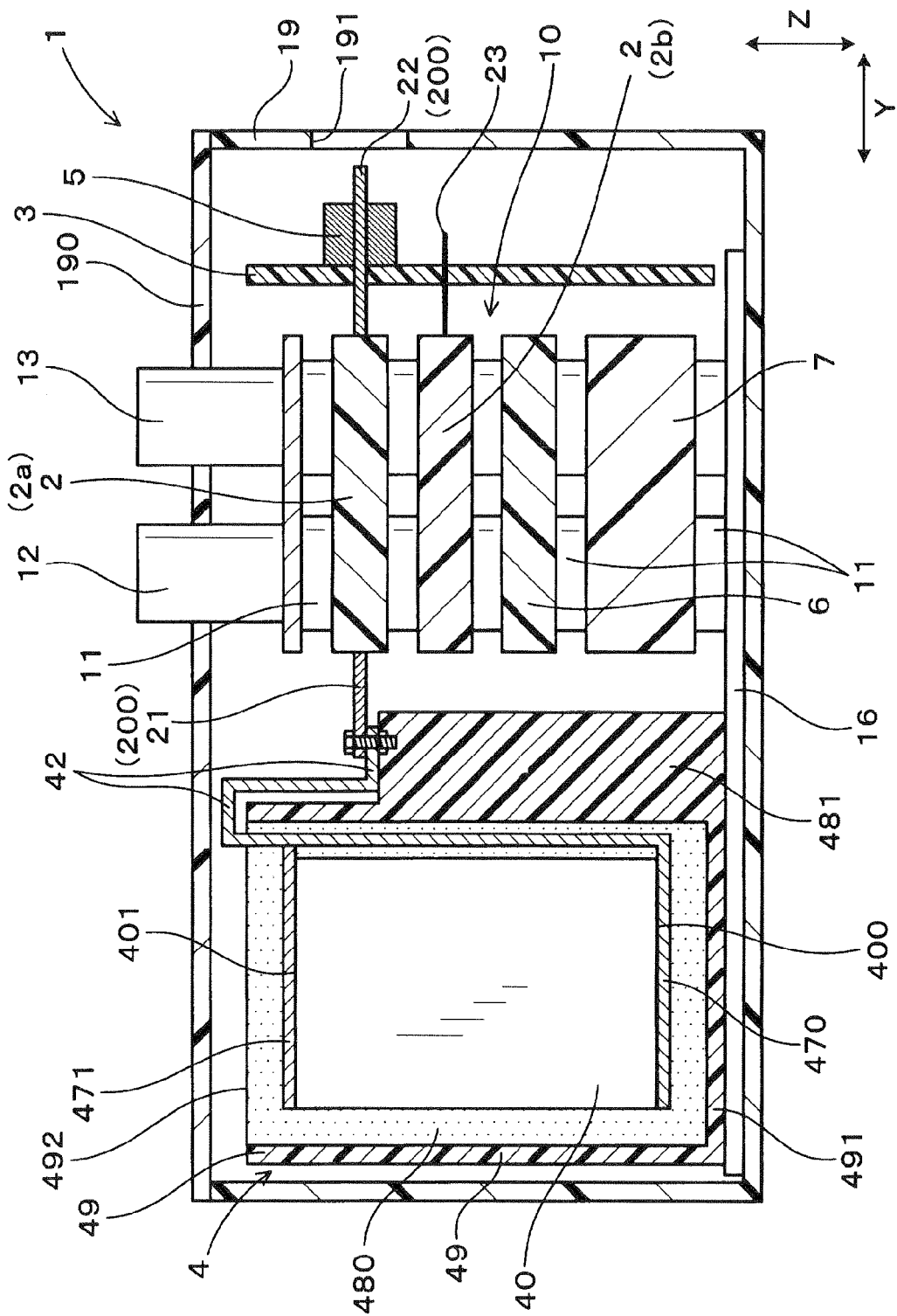
FIG. 7 shows a sectional view taken along a line VII-VII of FIG. 6.

Further, as shown FIG. 6 and FIG. 7, the capacitor 4 is provided with a capacitor case 49,
a plurality of capacitor elements 40 accommodated in the capacitor case 49, and a sealing member 480 that seals the capacitor element 40 inside the capacitor case 49.

The parts of the capacitor elements 40 constitute the smoothing capacitors 4a (refer to FIG. 10), and the other part constitutes the filter capacitor 4b. The capacitor elements 40 are film capacitors.

As shown in FIG. 7, end surfaces in a case bottom 491 side of the capacitor elements 40 are negative electrodes 400, and the other end surfaces 401 in a case opening 492 side are positive electrodes 401.

Negative electrode plates 470 are connected to the negative electrodes 400, and positive electrode plates 471 are connected to the positive electrodes 401.

The negative electrode plates 470 are connected in common to the negative electrodes 400 of all the capacitor elements 40, while the positive electrode plates 471 are connected only to the capacitor elements 40 for the smoothing capacitors 4a.

Negative terminals 42, 44, 46, and a negative input terminal 48 are connected to the negative electrode plates 470.

These terminals 42, 44, 46, and 48 are extended to the outside of the case from the case opening 492 of the capacitor case 49.

Further, positive terminals 41, 43, and 45 are connected to the positive electrode plates 471.

Figure 9:
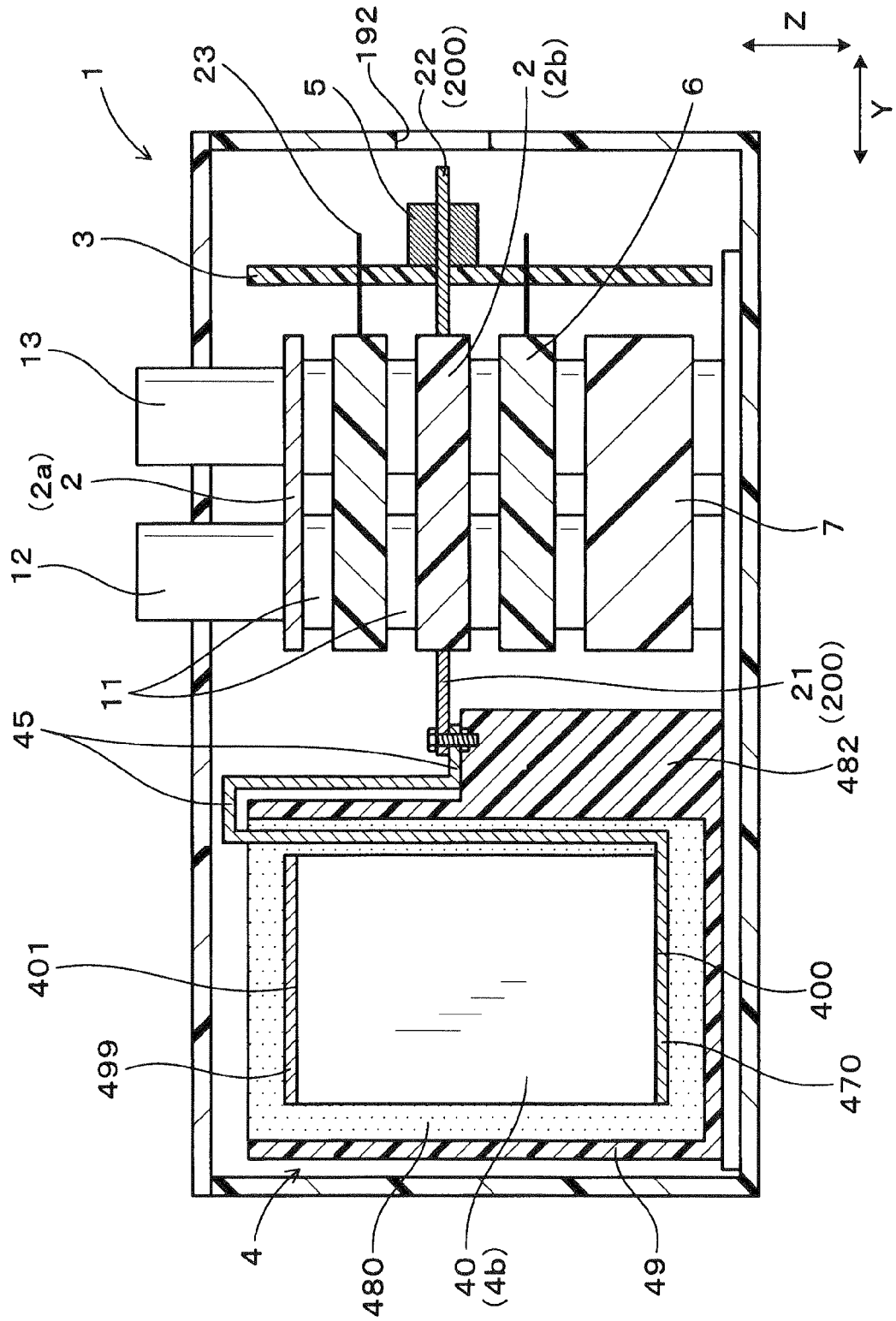
FIG. 9 shows a sectional view taken along a line IX-IX of FIG. 6.

On the other hand, the positive electrodes 401 of the capacitor elements 40 for the filter capacitor 4b are connected to another electrode plate 499 (refer to FIG. 9).

The positive input terminal 47 is connected to the electrode plate 499.

As shown FIG. 6 and FIG. 7, among the six terminals 41 to 46 of the capacitor 4 aligned in the X direction, the input terminals 21 of the semiconductor module 2a of an upper stage are connected to two terminals 41 and 42 disposed at a position farther from the input terminals 47 and 48 in the X direction.

The terminals 41 and 42 and the input terminals 21 are overlaid on a first seat 481 formed in the capacitor case 49 and fastened by bolts.

Figure 8:
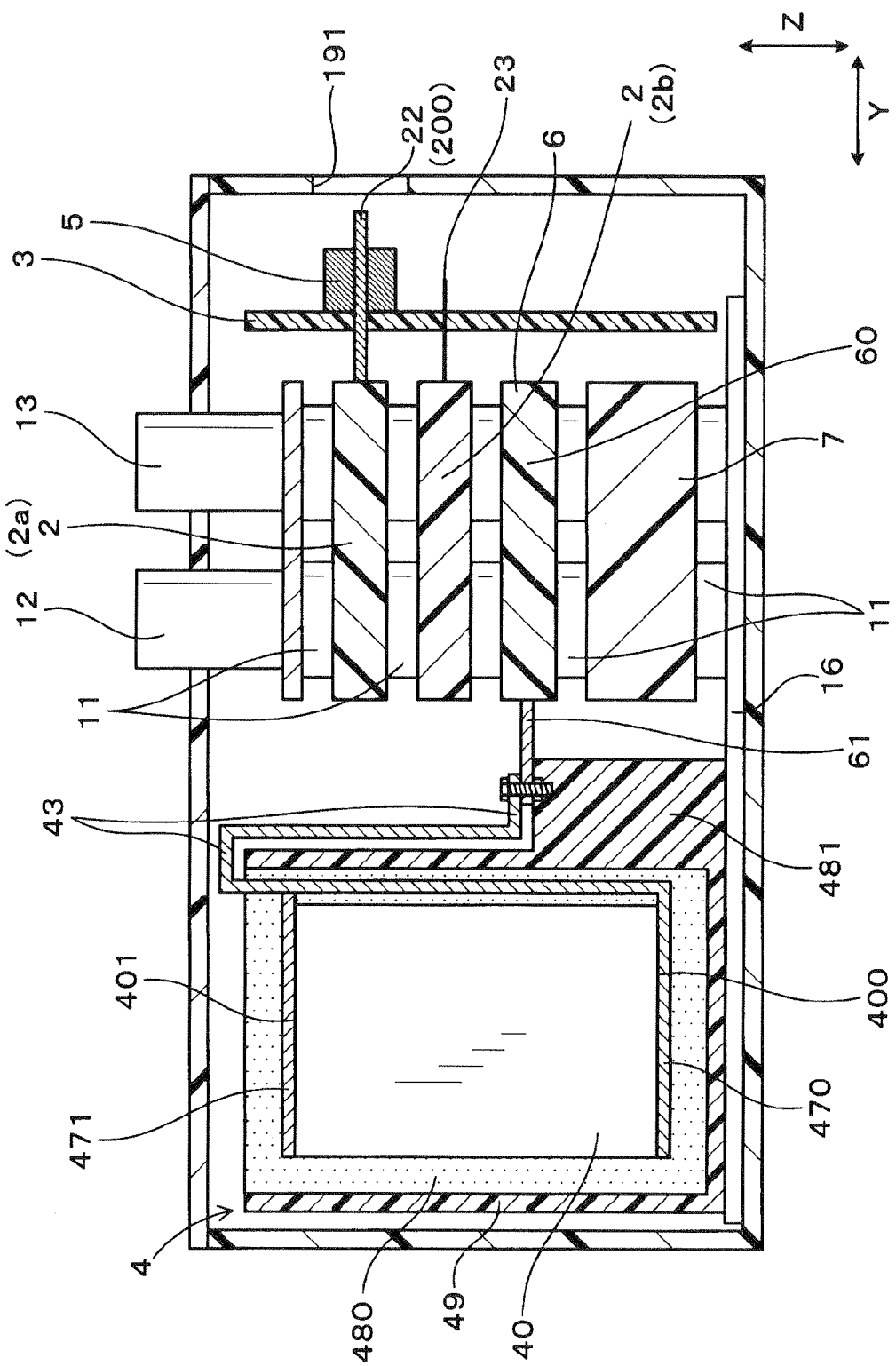
FIG. 8 shows a sectional view taken along a line VIII-VIII of FIG. 6.

Further, as shown FIGS. 6 and 8, among the six terminals 41 to 46 of the capacitor 4 aligned in the X direction, terminals 61 and 62 of the booster module 6 are connected to two terminals 43 and 44 disposed in the middle.

As shown in FIG. 8, the positive terminal 61 of the booster module 6 is extended in the Y direction from the main body 60 of the boosting module 6, and fastened by the bolt to the positive terminal 43 of the capacitor 4 in the first seat 481.

In addition, the negative terminal 62 of the booster module 6 also has a similar structure to the positive terminal 61.

Further, as shown FIG. 6 and FIG. 9, among the six terminals 41 to 46 of the capacitor 4 aligned in the X direction, the input terminals 21 of the semiconductor module 2b of an lower stage are connected to two terminals 45 and 46 disposed at a position closest to the input terminals 47 and 48 in the X direction.

The terminals 45 and 46 and the input terminals 21 are overlaid on a second seat 482 formed in the capacitor case 49 and fastened by the bolts.

Further, as shown in FIG. 6, output connector mounting holes 191 and 192 are formed in the case 19.

Output connectors (not shown) are attach to the output connector mounting holes 191 and 192, and are connected to the output terminals 22.

The output terminals 22 and the AC loads 80 (refer to FIG. 10) are electrically connected via the output connectors.

Further, an input connector mounting hole 193 is formed in the case 19.

Input connectors (not shown) are attach to the input connector mounting hole 193, and are connected to the input terminals 47 and 48.

The input terminals 47, 48 and the DC power supply 81 (refer to FIG. 10) are electrically connected via the input connectors.

In the present embodiment, there is provided a base plate 16 made of metal on a bottom surface of the case 19 (refer to FIG. 6, FIG. 7).

Columnar members (not shown) are disposed on the base plate 16.

Then, a plate-like member (not shown) is provided at a top of the stacked body 10, and the plate-like member is fixed to the columnar members.

The stacked body 10 is fixed by sandwiching the stacked body 10 by the plate-like member and the base plate 16 in the Z direction.

Next, functions and effects of the present embodiment are explained.

As shown in FIG. 6, in the electric power converter 1 of the present embodiment, the plurality of the power terminals 200 (the input terminals 21, output terminals 22) included respectively in the two semiconductor modules 2a and 2b adjoining in the Z direction do not overlap each other when viewed from the Z direction.

That is, the input terminals 21 of the two semiconductor module 2a, 2b do not overlap in the Z direction, and the output terminals 22 also do not overlap in the Z direction.

Therefore, spaces between the power terminals 200 in the Z direction can be prevented from being narrowed.

Therefore, it becomes possible to easily perform a process of connecting the power terminals 200 to connectors or bus bars.

Further, the output terminals 22 of the semiconductor modules 2 are disposed between the center 25 of the output side surface 241 and the end portion 26 in the present embodiment.

That is, the output terminals 22 of the semiconductor modules 2 are disposed at a position deviated either to the left or to the right in the X direction.

Moreover, as shown FIG. 1 and FIG. 6, among the two semiconductor modules 2 adjoining in the Z direction, one of the semiconductor modules 2a is disposed in a state of the front and back surfaces thereof being reversed relative to another semiconductor module 2b.

Therefore, when viewed from the Z direction, the output terminals 22 of the two semiconductor modules 2 may not overlap to each other.

Therefore, it becomes easy to perform a process of connecting the connectors, etc. to the output terminals 22.

Further, the plurality of the semiconductor modules 2 are formed in the same shape in the present embodiment.

Therefore, it becomes possible to reduce the types of the semiconductor modules 2 to be used.

As a result, manufacturing cost of the electric power converter 1 can be reduced.

Further, as shown in FIG. 3 in the present embodiment, the input side surface 242 is parallel to the output side surface 241.

In this way, the input terminals 21 are made to project in the opposite side to the output terminals 22.

Therefore, the connectors or the like connected to the output terminals 22 and the bus bars or the like connected to the input terminal 21 are less likely to interfere.

As a conclusion, it becomes possible to easily perform the process of connecting these parts.

Further, as shown in FIG. 3 in the present embodiment, the input terminals 21 are disposed between the center 251 of the input side surface 242 in the X direction and the end portion 281 in the X direction of the input side surface 242.

That is, the input terminals 21 are disposed at a position deviated either to the left or to the right in the X direction in the present embodiment.

Therefore, it becomes possible to stack the semiconductor modules 2 individually so that the input terminals 21 of two adjoining semiconductor modules 2 do not overlap each other when the stacked body 10 is viewed from the Z direction.

As a conclusion, it becomes possible to prevent the spaces between the input terminals 21 two adjoining semiconductor modules 2 from being narrowed, and enables easy connection of the input terminals 21 and the bus bars or the like.

Incidentally, although the input terminals 21 are disposed between the center 251 and the end portion 281, as shown in FIG. 3 in the present embodiment, the input terminals 21 may be disposed between the center 251 and the other end portion 282.

Further, the control terminals 23 are projected from the output side surface 241, as shown in FIG. 3 in the present embodiment.

The control terminals 23 are disposed between the center 25 in the X direction of the output side surface 241 and the end portion 27 in the X direction of the output side surface 241.

Suppose the control terminals 23 are to be projected from the input side surface 242, a space for interposing the control circuit board 3 between the main bodies 20 of the semiconductor modules 2 and the smoothing capacitors 4a connected to the input terminals 21 is necessary to be secured to the control terminals 23 in order to attach the control circuit board 3 thereto.

Thus, the input terminals 21 are likely to be long.

Therefore, stray inductance of the input terminals 21 increases and a surge is likely to be high.

Therefore, as in the present embodiment, when the control terminals 23 are to be projected from the output side surface 241, it becomes possible to shorten the input terminals 21, and thus the stray inductance and surge can be reduced.

Further, as shown in FIG. 6 in the present embodiment, since the length of the output terminal 22 is longer than the length of the control terminal 23, it becomes possible to connect the connectors or the like to tips of the output terminals 22, and the interference between the control terminals 23 and the connectors or the like can be prevented.

Moreover, since it is configured such that the output terminals 22 of the one of the semiconductor modules 2 and the control terminals 23 of the other one of the semiconductor modules 2 overlap when viewed from the Z direction in the present embodiment, it becomes easy to reduce the size of the stacked body 10.

Furthermore, as shown in FIG. 6, the principal surface of the control circuit board 3 is orthogonal to the projecting direction (Y direction) of the output terminal 22.

In this way, when an output current flow through the output terminals 22 and a magnetic field is generated in the neighborhood of the output terminals 22, the control circuit board 3 is parallel to the magnetic field.

Therefore, an amount of a magnetic flux interlinking to the control circuit board 3 is reduced.

As a conclusion, the control circuit board 3 is less likely to be affected by the noise.

Further, as shown in FIG. 6, the current sensors 5 are attached to the control circuit board 3.

Therefore, wires for connecting the control circuit board 3 and the current sensors 5 are not required. As a result, manufacturing cost of the electric power converter 1 can be reduced.

Furthermore, as shown in FIG. 2 in the present embodiment, the current sensors 5 are not intended to be attached to two closest output terminals 22c at the same time.

Assuming that attaching the current sensors 5 to two closest output terminals 22c at the same time, these two current sensors 5 get closer and may interfere with each other.

Therefore, as in the present embodiment, if the current sensors 5 are not attached to two closest output terminals 22c at the same time, it becomes possible to make a distance between two current sensors 5 sufficiently long.

As a result, interference between the current sensors 5 can be suppressed.

In addition, the current sensor 5 may be attached to the adjoining output terminal 22b in the one of the semiconductor modules 2a.

Further, the current sensor 5 may be attached to the adjoining output terminal 22b or the farthest input terminal 22a of the other one of the semiconductor module 2b.

Further, although a single current sensor 5 is attached to a single semiconductor module 2 in the present embodiment, two current sensors 5 may be attached to the single semiconductor module 2.

That is, the current sensors 5 may be attached respectively to each of two output terminals 22 of the single semiconductor modules 2.

As described above, according to the present embodiment, it becomes possible to provide the electric power converter that can connect the power terminals easily to the bus bars or connectors.

Although an example of configuring the coolers 11 as cooling pipes having refrigerant passages therein and the coolers 11 are brought into contact with the semiconductor modules 2 in the above embodiment, the electric power converter of the present disclosure 1 is not limited thereto.

That is, the coolers 11 may be configured as heat sinks made of metal having no refrigerant passages.

It is also possible to configure that the refrigerant 15 contacts directly with the semiconductor modules 2.

Further, although the electric power converter 1 is constituted using the two semiconductor modules 2 in the present embodiment, it is also possible to use 3 or more semiconductor modules 2 to do so.

In this case, the stacked body 10 is formed by reversing alternately the front and back surfaces of the semiconductor modules 2 when stacking.

Further, although both of the input terminal 21 and output terminal 22 are constituted so as not to overlap each other when viewed from the Z direction in the present embodiment, only one of the either may not be overlapped.

That is, only the input terminals 21 may not overlap in the Z direction, or only the output terminals 22 may not overlap in the Z direction.

Second Embodiment

It should be appreciated that, in the second and the third embodiments, components identical with or similar to those in the first embodiment are given the same reference numerals, and structures and features thereof will not be described in order to avoid redundant explanation.

Figure 11:
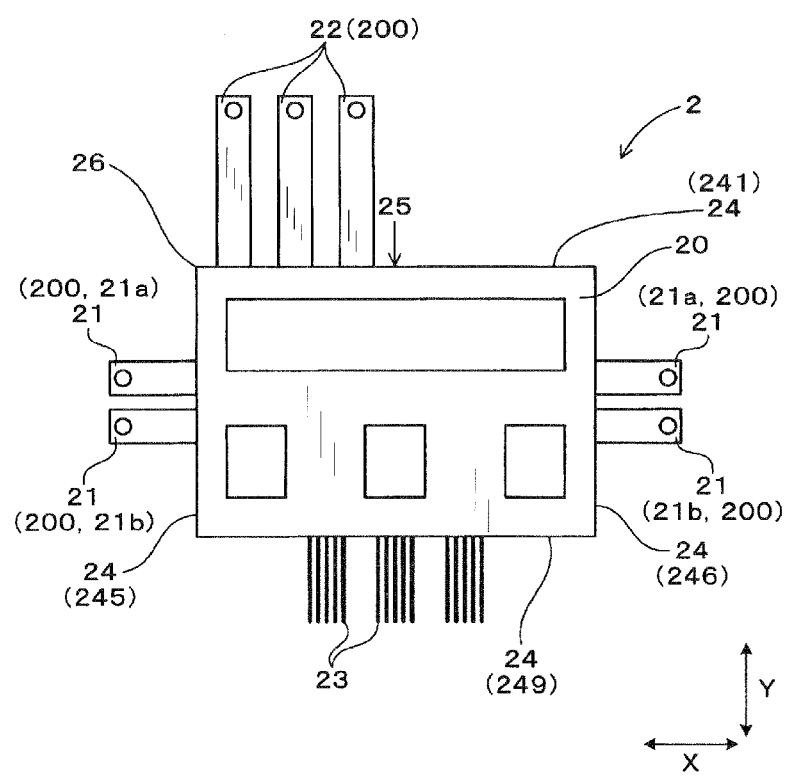
FIG. 11 shows a plan view of a semiconductor module in a second embodiment.

The present embodiment is an example that the shape of the semiconductor modules 2 has been changed as shown in FIG. 11.

In the present embodiment, three output terminals 22 are disposed at a position deviated either to the left or to the right in the longitudinal direction (X direction) of the main body 20 as in the first embodiment.

That is, the output terminals 22 are disposed between the center 25 of the output side surface 241 and the end portion 26 in the X direction.

The control terminals 23 are projected from the side surface 24 (control side surface 249) of the main body 20 that is parallel to the output side surface 241.

The control terminals 23 are disposed substantially in the center in the X direction of the control side surface 249.

Further, the input terminals 21 are projected from two side surfaces 24 (input side surfaces 245, 246) that are orthogonal to the output side surface 241 of the main body 20.

In the present embodiment, the semiconductor module 2 with two each of the positive input terminals 21a and the negative input terminal 21b are prepared in advance.

Then as described below, the stacked body 10 is constituted by cutting one of the input terminals 21.

Figure 12:
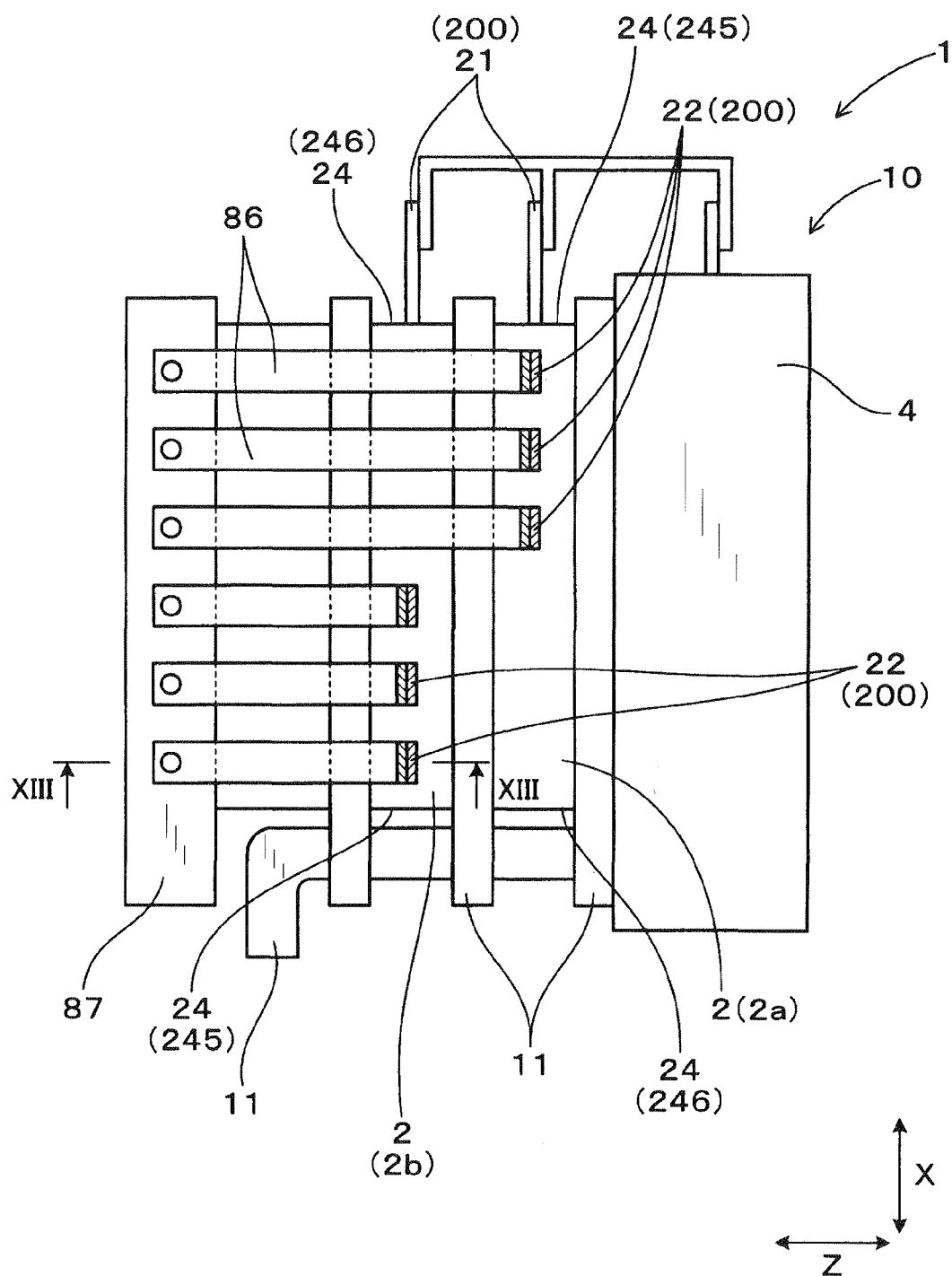
FIG. 12 shows a side view of an electric power converter in the second embodiment.

As shown in FIG. 12, the electric power converter 1 of the present embodiment is constituted by stacking the capacitor 4, the two semiconductor modules 2, and the coolers 11.

As in the first embodiment, one of the semiconductor modules 2a is disposed in a state of the front and back surfaces thereof being reversed relative to the other semiconductor module 2b.

Therefore, when viewed from the stacking direction (Z direction), the output terminals 22 of the two semiconductor modules 2 may not overlap to each other.

Bus bars 86 are attached to the output terminals 22.

The bus bars 86 extend in the Z direction, and tips thereof are placed on a terminal block 87.

Figure 13:
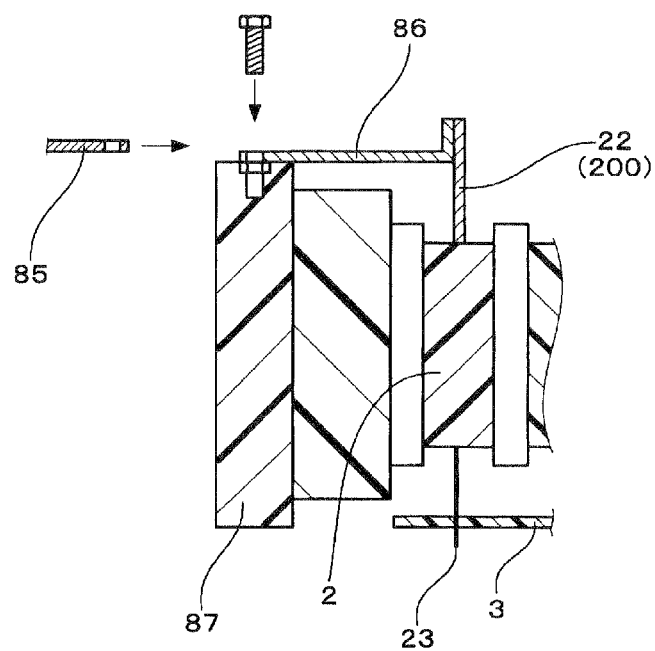
FIG. 13 shows a sectional view taken along a line XIII-XIII of FIG. 12.

As shown in FIG. 13, terminals 85 of connectors and the bus bars 86 are overlaid on the terminal block 87 and fastened by the bolts.

As shown in FIG. 12 in the present embodiment, among the two semiconductor modules 2, one of the semiconductor modules 2a has remained the input terminals 21 in the one of the input side surfaces 245 and deleted the input terminals 21 in the other one of the input side surfaces 246.

Moreover, the other one of the semiconductor modules 2*b* has left the input terminals 21 in the other one of the input side surfaces 246 and cut off the input terminals 21 in the one of the input side surfaces 245.

Then input terminals 21 that have been left are connected to the capacitor 4.

In the present embodiment, by preparing in advance the semiconductor modules 2 that have the input terminals 21*a* and 21*b* projected from the input side surfaces 245, 246, respectively, the input terminals 21 project in the same direction from each of the two semiconductor modules 2 even if the one of the semiconductor modules 2*a* is disposed reversing the front and back surfaces thereof relative to the other one of the semiconductor modules 2*b*.

Thus, it is constituted that the input terminals 21 can be connected to the capacitor 4.

Figure 14:
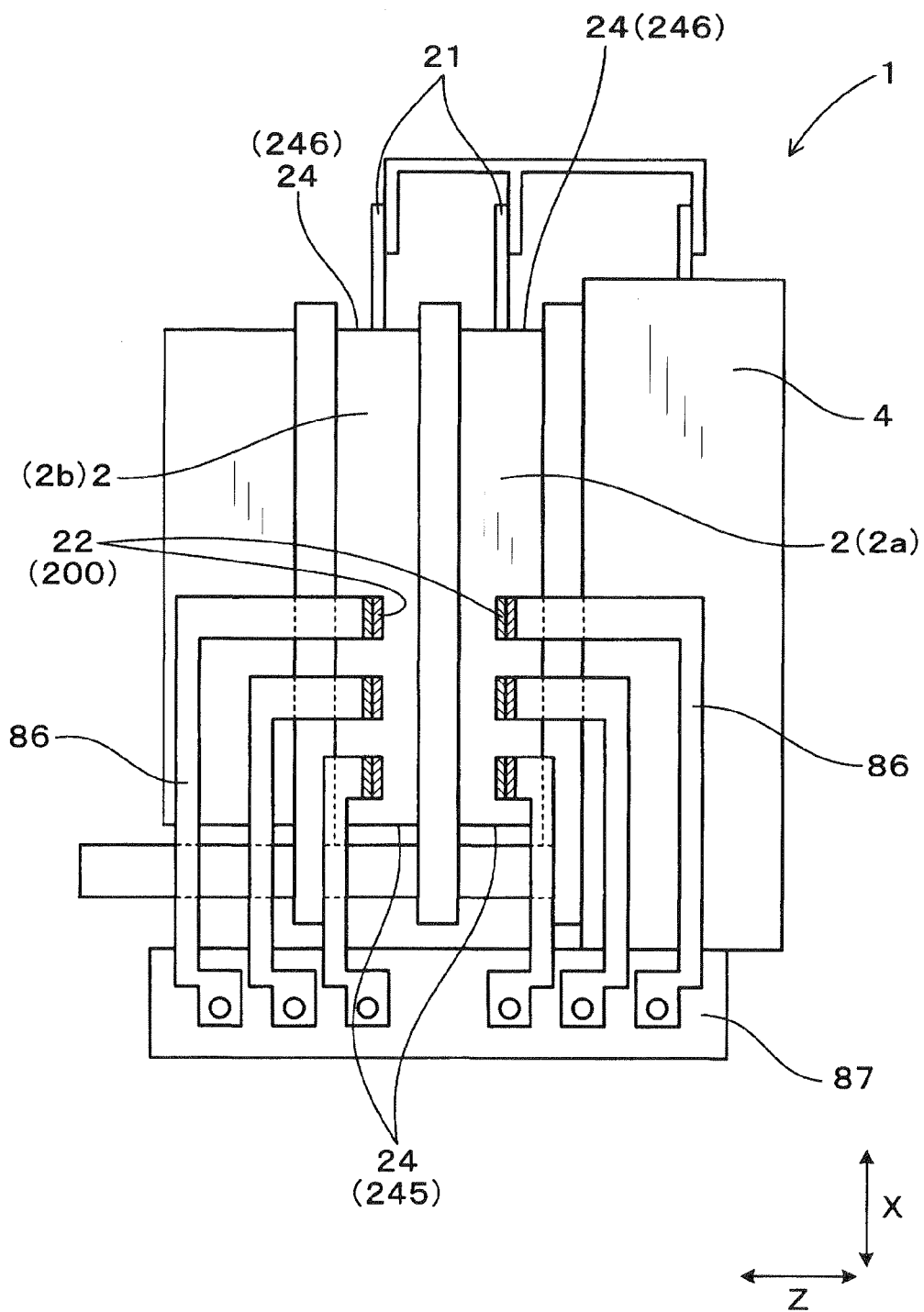
FIG. 14 shows a side view of the electric power converter that the semiconductor modules are stacked without having the one of the semiconductor modules being reversed the front and back surfaces thereof relative to the other one of the semiconductor modules in the second embodiment.

Incidentally, as shown in FIG. 14 in the present embodiment, it is possible to dispose the one of the semiconductor modules 2*a* without reversing the front and back surfaces thereof relative to the other one of the semiconductor modules 2*b*.

In this case, for the two semiconductor modules 2*a*, 2*b*, only the input terminals 21 in the other one of the input side surfaces 246 are left, and the input terminals 21 in the one of the input side surfaces 245 are cut off.

Further, the bus bars 86 attached to the output terminals 22 are extended to the other one of the input side surfaces 245 side in the X direction.

Then, tips of the bus bars 86 are placed on the terminal block 87.

Thus, in the present embodiment, it becomes possible to form two types of the electric power converter 1 (FIG. 12, FIG. 14) by using a single type of the semiconductor module 2.

Other features are the same as in the first embodiment.

Third Embodiment

The present embodiment is an example that the shape of the semiconductor module 2 has been changed.

Figure 25:
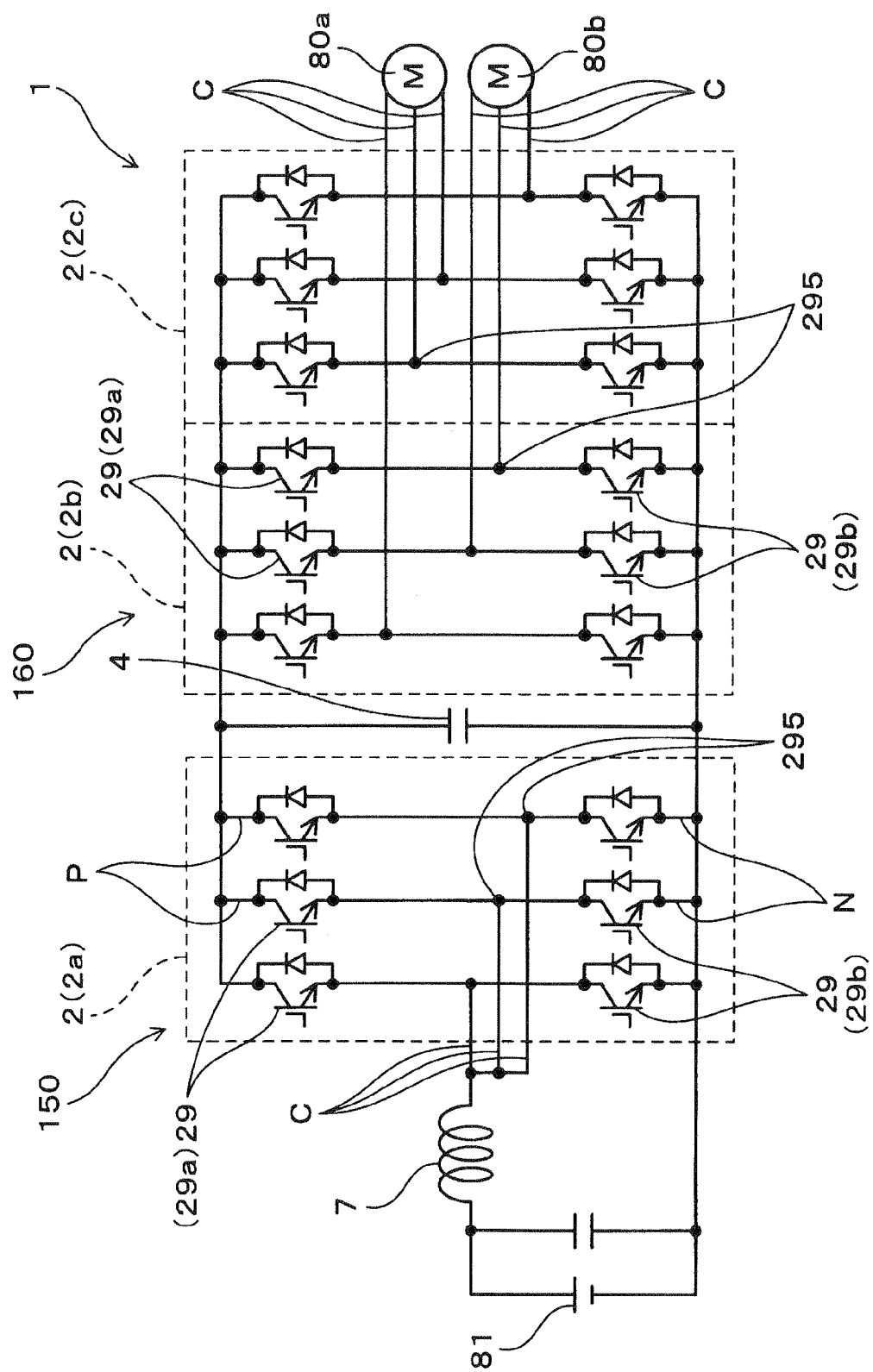
FIG. 25 shows a circuit diagram of the electric power converter in the third embodiment.

As shown in FIG. 25, the semiconductor module 2 of the present embodiment includes two types of semiconductor elements 29*a*, namely upper arm semiconductor elements 29*a* and lower arm semiconductor elements 29*b* that are connected in series with each other.

Figure 15:
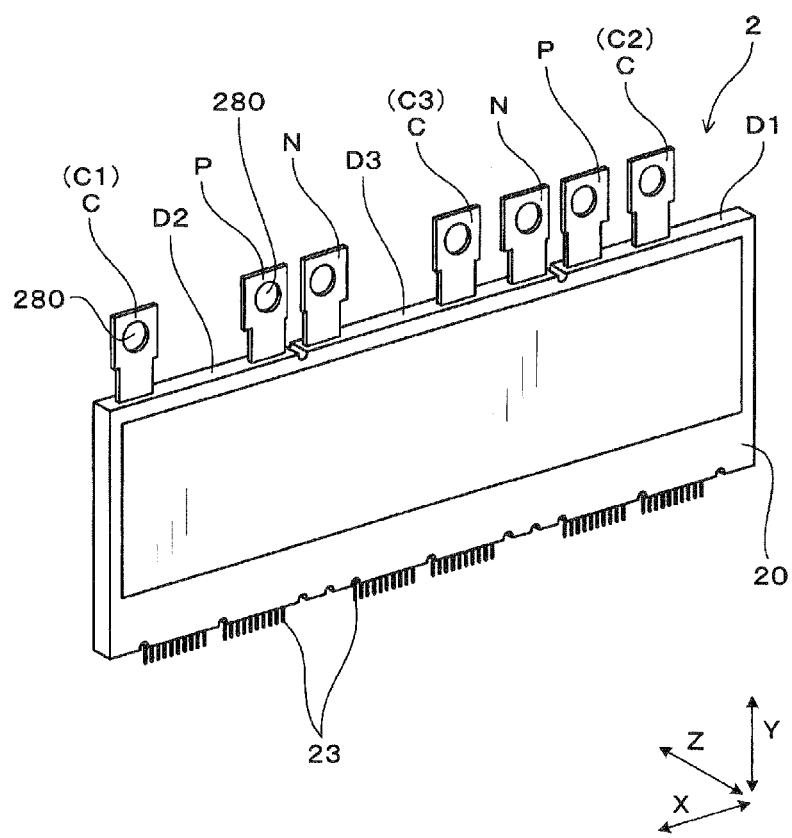
FIG. 15 shows a perspective view of a semiconductor module in a third embodiment.

Further, as shown FIG. 15 and FIG. 25, the semiconductor module 2 of the present embodiment has positive terminals P, negative terminals N, and intermediate terminals C as the power terminals 200.

The positive terminals P are electrically connected to the positive electrode of the capacitor 4, and the negative terminals N are electrically connected to the negative electrode of the capacitor 4.

The intermediate terminals C are electrically connected between the upper arm semiconductor elements 29*a* and the lower arm semiconductor elements 29*b*.

Figure 19:
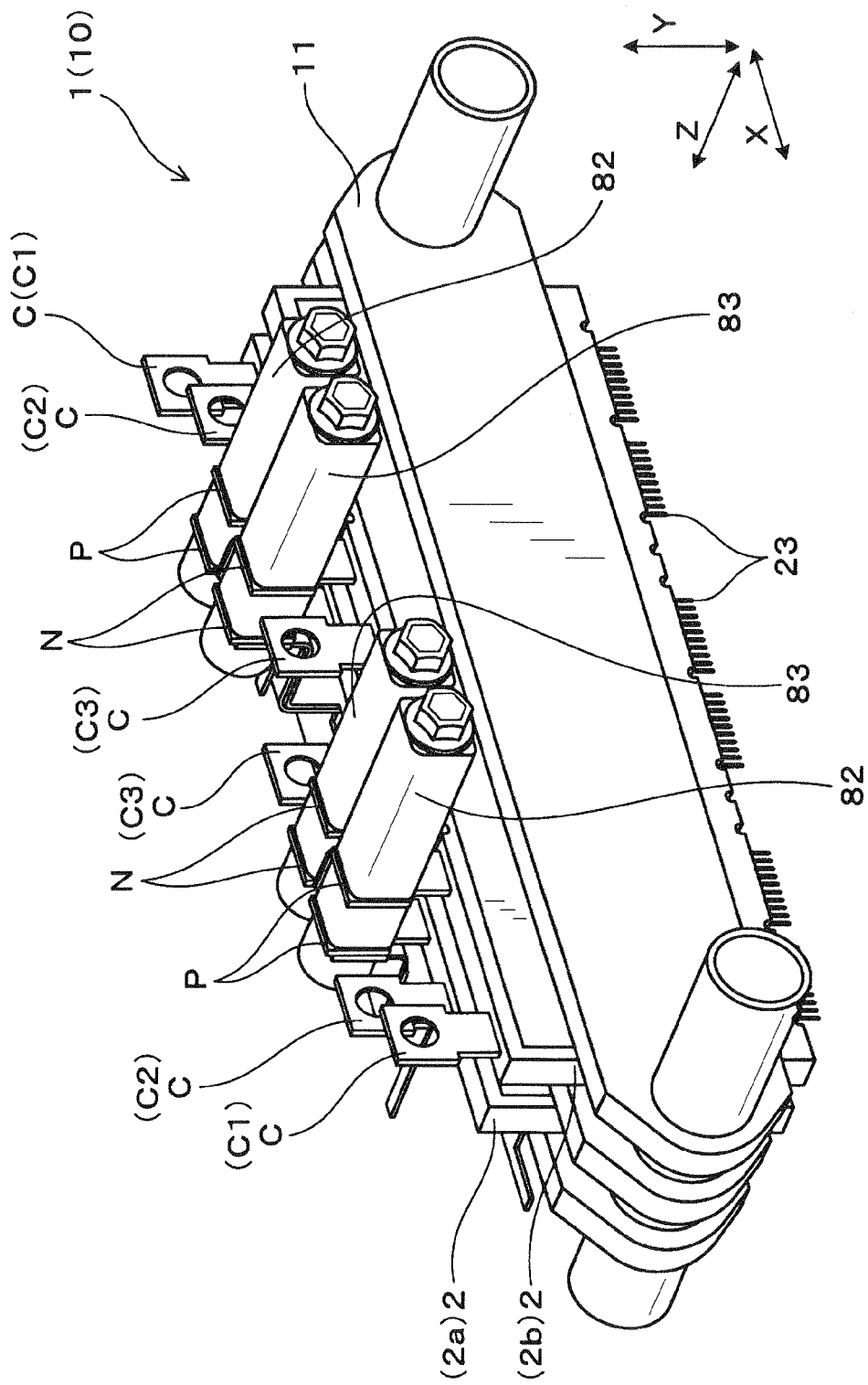
FIG. 19 shows a perspective view of a part of the electric power converter in the third embodiment.
Figure 20:
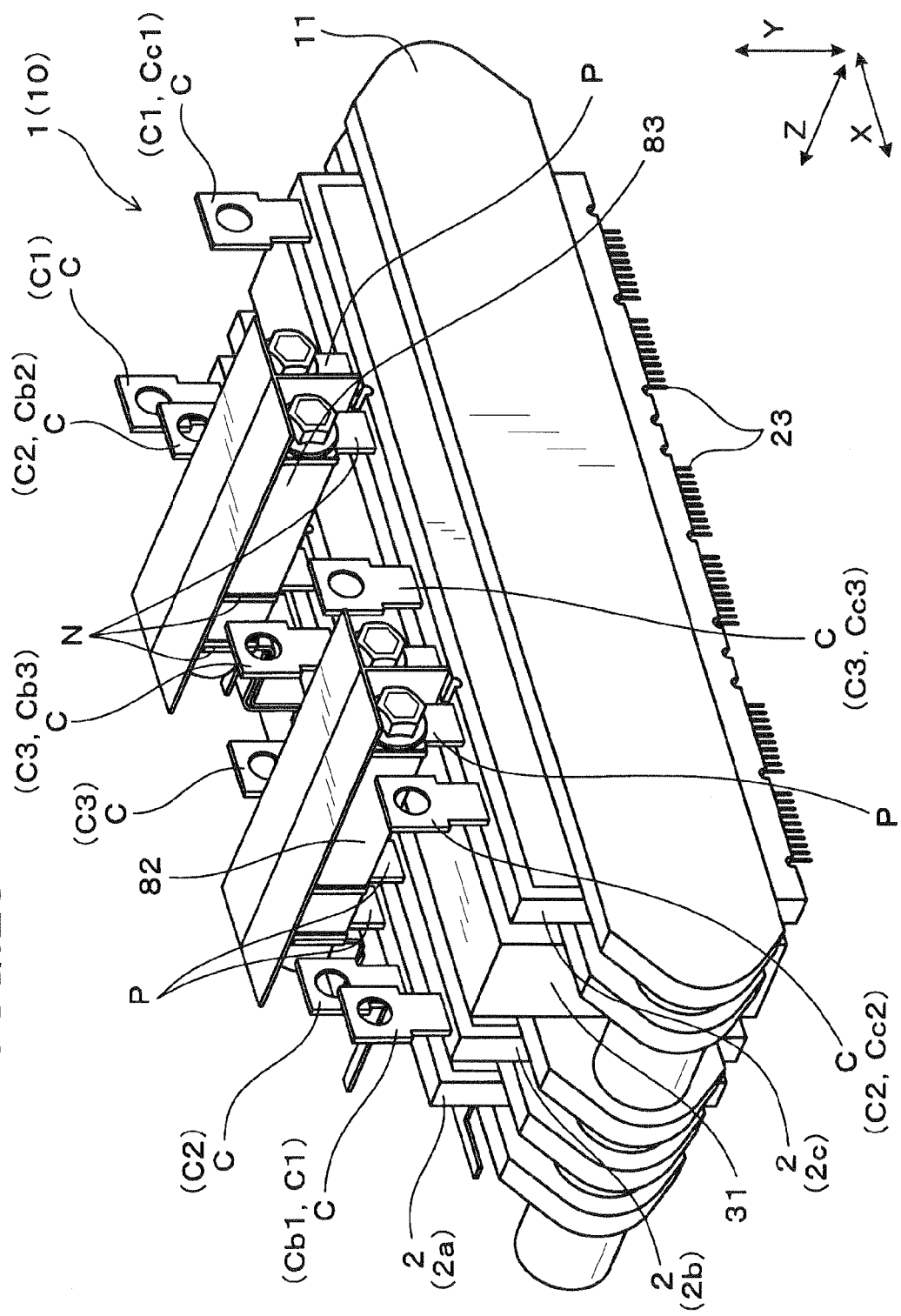
FIG. 20 shows a perspective view of the electric power converter in the third embodiment.

Further, as shown FIG. 19 and FIG. 20 in the present embodiment, the stacked body 10 is constituted by stacking the plurality of the semiconductor modules 2.

It is constituted that when viewed from the Z direction, the intermediate terminals C of the two semiconductor modules 2*a*, 2*b* adjoining in the Z direction do not overlap with each other, and the positive terminals P are configured to overlap each other as well as the negative terminals N.

The electric power converter 1 of the present embodiment has three semiconductor modules 2 (2*a* to 2*c*).

As shown in FIG. 25, the first semiconductor module 2*a* is used in the booster circuit 150.

The intermediate terminals C of the first semiconductor module 2*a* are connected to the reactor 7.

The positive terminals P of the first semiconductor module 2*a* are connected to the positive electrode of the capacitor 4, and the negative terminals N are connected to the negative electrode of the capacitor 4.

Further, in the present embodiment, an inverter circuit 160 is constituted by the second semiconductor module 2*b* and the third semiconductor module 2*c*.

The inverter circuit 160 is a circuit for converting a DC voltage boosted by the booster circuit 150 to an AC voltage.

The intermediate terminals C of the two semiconductor module 2*b*, 2*c* are connected to the AC load 80*a*, 80*b* (the three-phase AC motors), respectively.

The three semiconductor modules 2*a* to 2*c* are formed in the same shape.

Figure 16:
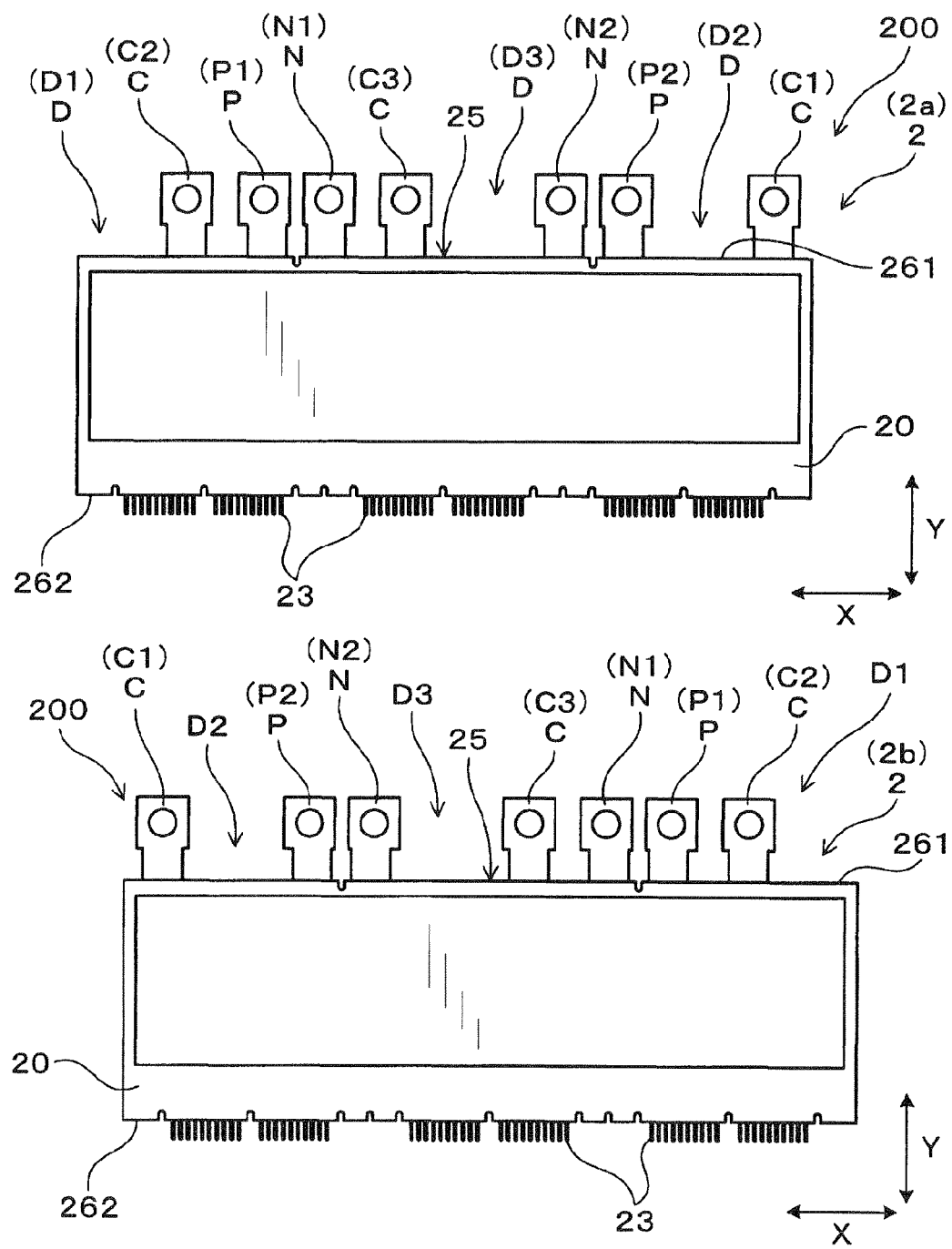
FIG. 16 shows a plan view of the two semiconductor modules in which one of them is disposed reversing front and back surfaces thereof in the third embodiment.

As shown in FIG. 16, each of the semiconductor modules 2 has three intermediate terminals C (C1 to C3), two positive terminals P (P1, P2), and two negative terminals N (N1, N2).

Figure 21:
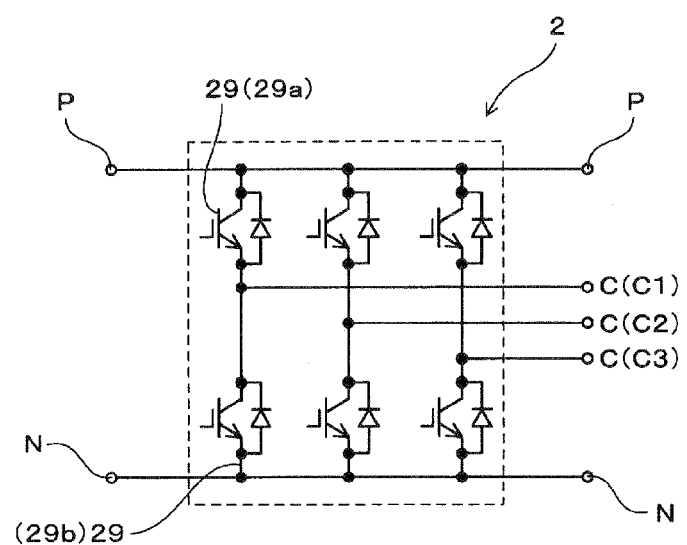
FIG. 21 shows a circuit diagram of the semiconductor module in the third embodiment.

Between the two positive terminals P is connected in the semiconductor modules 2 and between the two negative terminals N is as well (refer to FIG. 21.)

As shown in FIG. 16, the main body 20 of the each semiconductor modules 2 is formed in the quadrilateral-plate shape.

Among the side surfaces 261, 262 of the main body 20 that are in parallel with each other, all of the power terminals 200 are projected from one of the side surfaces 261.

Further, the control terminals 23 are projected from the other one of the side surfaces 262 of the main body 20.

Non-projection regions D (D1 to D3) where no power terminal 200 projects are formed in the one of the side surfaces 261.

Figure 17:
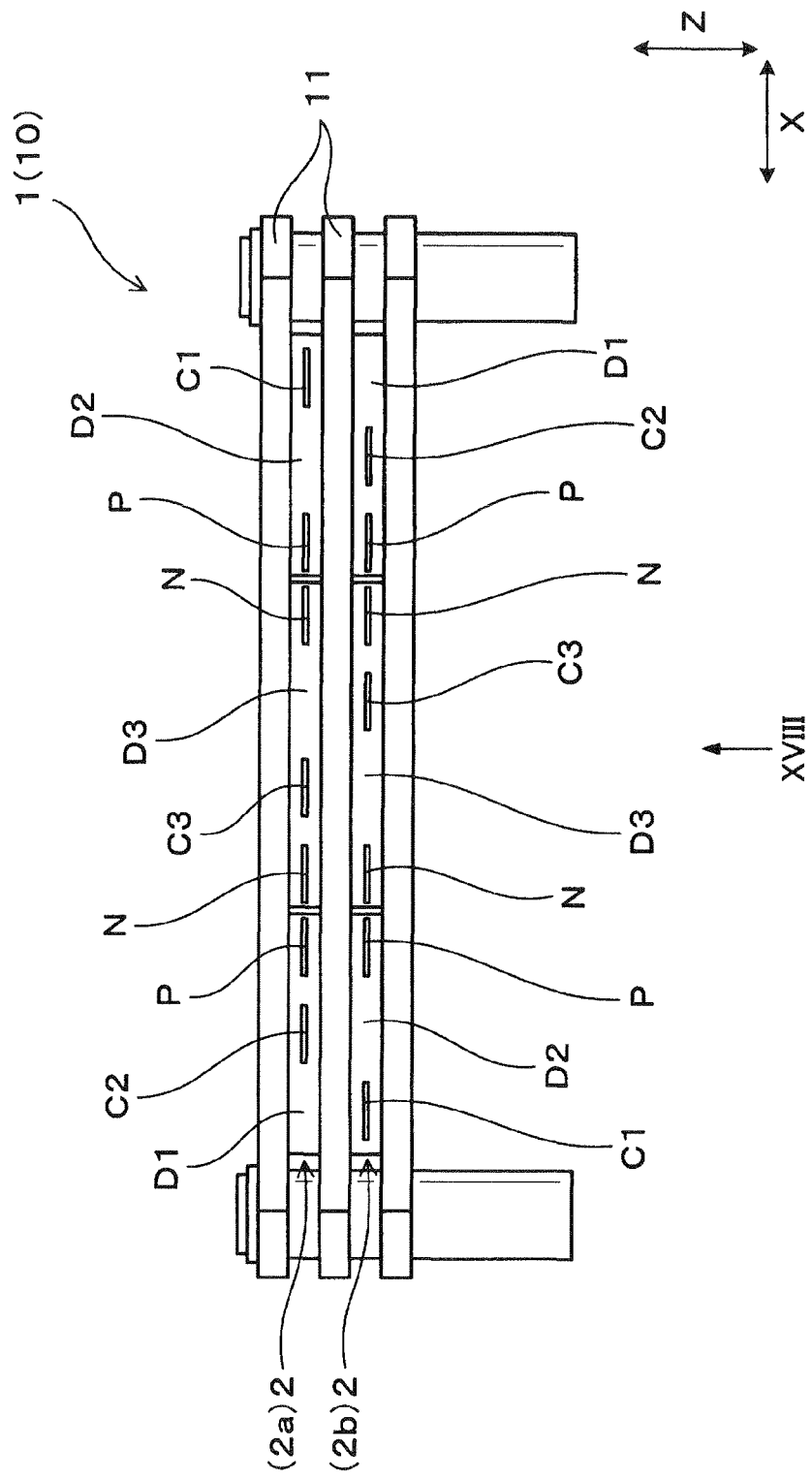
FIG. 17 shows a plan view of a part of an electric power converter in the third embodiment.
Figure 18:
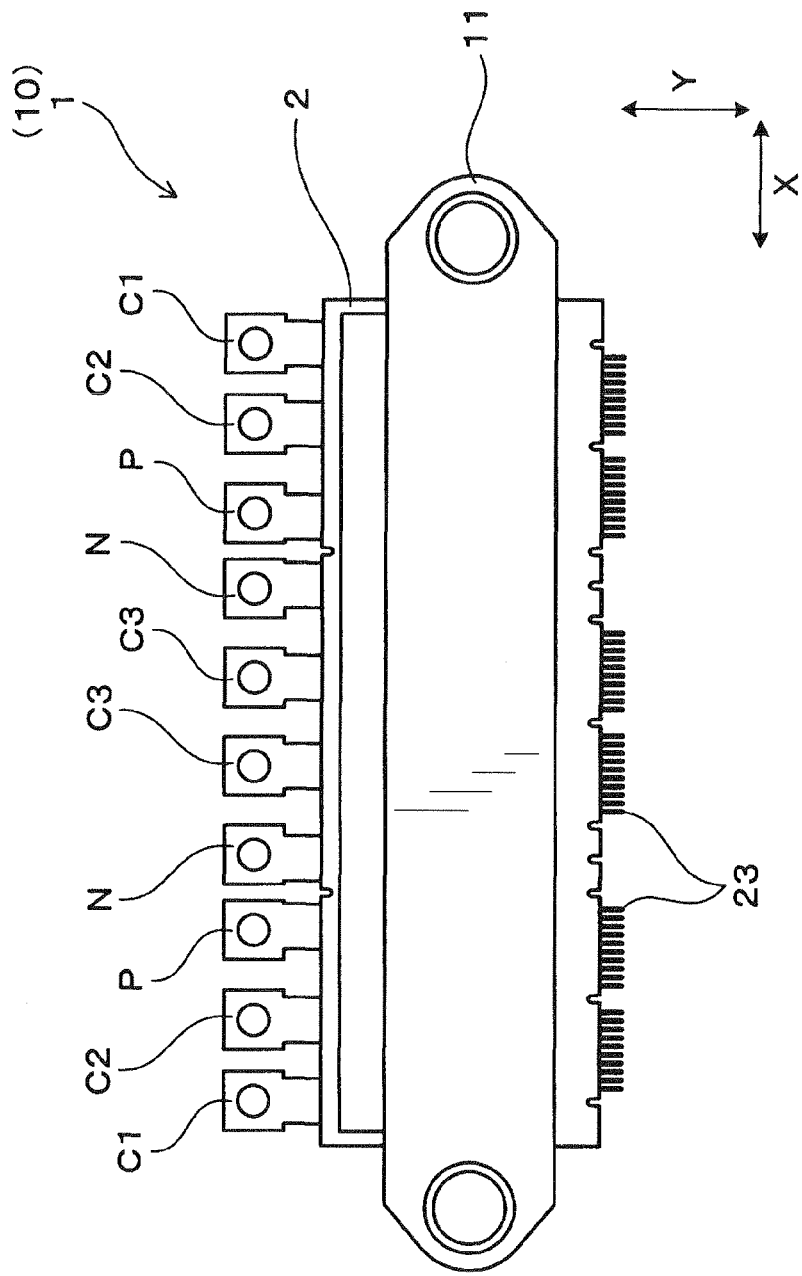
FIG. 18 shows a front view of FIG. 17 viewed along an arrow XVIII in the third embodiment.

As shown FIG. 17, FIG. 18, when overlaying the two semiconductor module 2*a*, 2*b*, of which one of them is disposed reversing the front and back surfaces thereof, the non-projecting regions D of the first semiconductor module 2*a* and the intermediate terminals C of the second semiconductor module 2*b* overlap in the Z direction.

Further, the non-projecting regions D of the second semiconductor module 2*b* and the intermediate terminals C of the first semiconductor module 2*a* overlap in the Z direction.

Thereby, it is constituted that the intermediate terminals C of the two semiconductor module 2*a*, 2*b* do not overlap with each other in the Z direction.

As shown in FIG. 16, the first non-projecting region D1 of the first semiconductor module 2*a* is formed at one end of the side surface 261.

Further, the first intermediate terminal C1 is formed at another end of the side surface 261.

The first non-projection regions D1 and the first intermediate terminal C1 are formed at positions symmetrical with respect to the center 25 in the X direction of the side surface 261.

The second intermediate terminal C2 is formed at an inner side of the first non-projecting region D1, and the second non-projection region D2 is formed at the inner side of the first intermediate terminal C1.

The second intermediate terminal C2 and the second non-projection region D2 are formed at positions symmetrical with respect to the center 25.

The positive terminal P (first positive terminal P1) is formed at the inner side of the second intermediate terminal C2, and the negative terminal N (first negative terminal N1) is formed at the inner side of the first positive terminal P1.

Further, the positive terminal P (second positive terminal P2) is formed at the inner side of the second non-projecting region D2, and the negative terminal N (second negative terminal N2) is formed on the inner side of the second positive terminal P2.

The two positive terminals of P1, P2 are formed at positions symmetrical with respect to the center 25.

Similarly, two negative terminals N1, N2 are also formed at positions symmetrical with respect to the center 25.

The third intermediate terminal C3 is formed at the inner side of the first negative terminal N1, and the third non-projecting region D3 is formed at the inner side of the second negative terminal N2.

The third intermediate terminal C3 and the third non-projecting region D3 are formed at positions symmetrical with respect to the center 25.

The second semiconductor module 2b also has a structure similar to that of the first semiconductor module 2a.

When the second semiconductor module 2b is disposed reversing the front and back surfaces thereof with respect to the first semiconductor module 2a and they are stacked together, as shown FIG. 17 and FIG. 18, the first intermediate terminals C1 and the first non-projection regions D1 of the two semiconductor modules 2a, 2b overlap in the Z direction, and the second intermediate terminals C2 and the second non-projecting regions D2 overlap in the Z direction.

Further, between negative terminals N and between the positive terminals P of the two semiconductor modules 2a, 2b overlap with each other in the Z direction.

Furthermore, the third non-projection regions D3 of the two semiconductor module 2a, 2b and the third intermediate terminals C3 overlap in the Z direction.

Accordingly, in the present embodiment, by using the two semiconductor module 2a, 2b formed in the same shape, and reversing the front and back surfaces of the one of the semiconductor module 2b with respect to the other one of the semiconductor module 2a and stacking them together, the positive terminals P overlap each other in the Z direction, the negative terminals N overlap each other in the Z direction, and the intermediate terminals C (C1 to C3) do not overlap in the Z direction.

As shown in FIG. 19, the positive terminals P and the negative terminals N respectively overlapping each other in the Z direction are electrically connected to each other by bus bars 82, 83.

Further, as shown in FIG. 20 in the present embodiment, the third semiconductor module 2c is stacked to the second semiconductor module 2b in a state of the front and back surfaces thereof being reversed relative to the second semiconductor module 2b.

The positive terminals P and the negative terminals N of the third semiconductor module 2c overlap the positive terminals P and the negative terminals N of the other semiconductor modules 2a, 2b, respectively, in the Z direction.

Further, in the second semiconductor module 2b and the third semiconductor module 2c adjoining to each other in the Z direction, the intermediate terminals C of each do not overlap in the Z direction.

As described above, in the present embodiment, the first semiconductor module 2a is used in the booster circuit 150 (refer to FIG. 25), and the second semiconductor module 2b and the third semiconductor module 2c are used in the inverter circuit 160.

The first intermediate terminal C1 ($C_{c1}$) of the third semiconductor module 2c, and the second intermediate terminal C2 ($C_{b2}$) and the third intermediate terminal C3 ($C_{b3}$) of the second semiconductor module 2b are connected to the one of the AC loads 80a.

Further, the first intermediate terminal C1 ($C_{b1}$) of the second semiconductor module 2b, and the second intermediate terminal C2 ($C_{c2}$) and the third intermediate terminal C3 ($C_{c3}$) of the third semiconductor module 2c are connected to the other one of the AC loads 80b.

Figure 22:
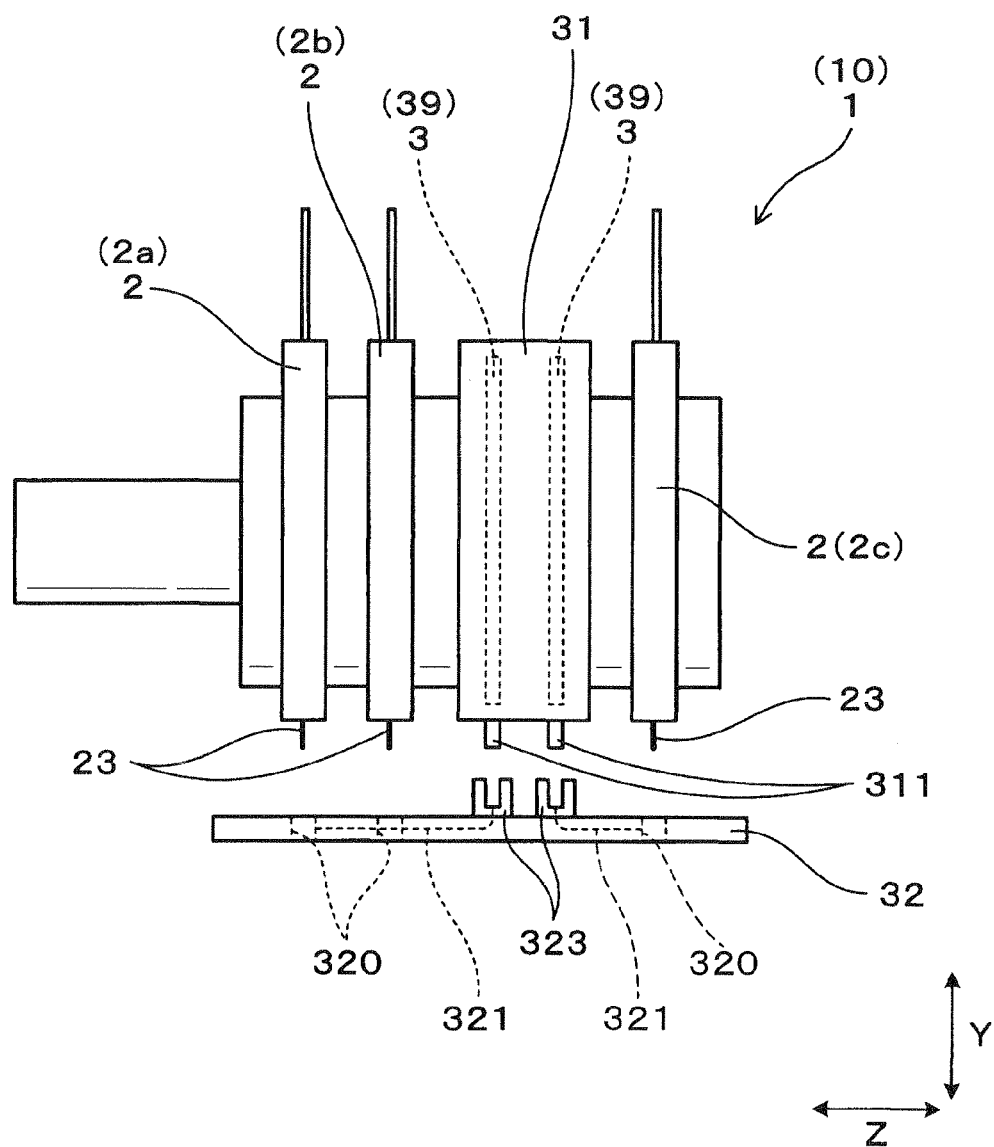
FIG. 22 shows a side view of the electric power converter in the third embodiment.

Furthermore, as shown FIG. 20 and FIG. 22, a control module 31 is disposed between the second semiconductor module 2b and the third semiconductor module 2c.

The control module 31 has the control circuit board 3 therein.

The control circuit 39 for controlling the semiconductor modules 2 is formed on the control circuit board 3.

As shown in FIG. 22, the control module 31 and the semiconductor modules 2 are electrically connected via a connecting board 32.

The connecting board 32 is mainly made of an insulating resin, and recesses 323 made of metal are formed on the surface of the connecting board 32. Further, through holes 320 are formed in the connecting board 32. The through holes 320 and the recesses 323 are electrically connected by wires 321.

The semiconductor modules 2 and the control module 31 are configured to be connected by inserting the control terminals 23 of the semiconductor modules 2 into the through holes 320 and fitting terminals 311 of the control module 31 into the recesses 323.

Although the control circuit 39 is formed by using the control circuit board 3 built in the control module 31 in the present embodiment, the control circuit board 3 may not be used.

That is, electronic components such as semiconductor chips are sealed in the control module 31 without mounting on the control circuit board 3, and the control circuit 39 may be configured by using the sealed electronic components.

Next, the structure of the bus bars 82, 83 is explained.

Figure 24:
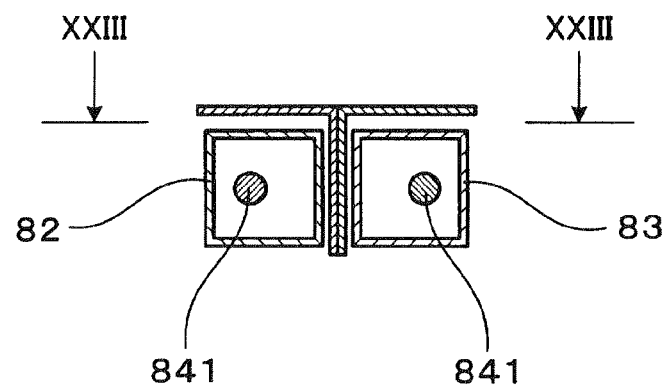
FIG. 24 shows a sectional view take along a line XXIV-XXIV of FIG. 23.

As shown in FIG. 24, each of the bus bars 82, 83 of the present embodiment is formed into a shape having a rectangular cross section, and inside thereof is hollow.

Figure 23:
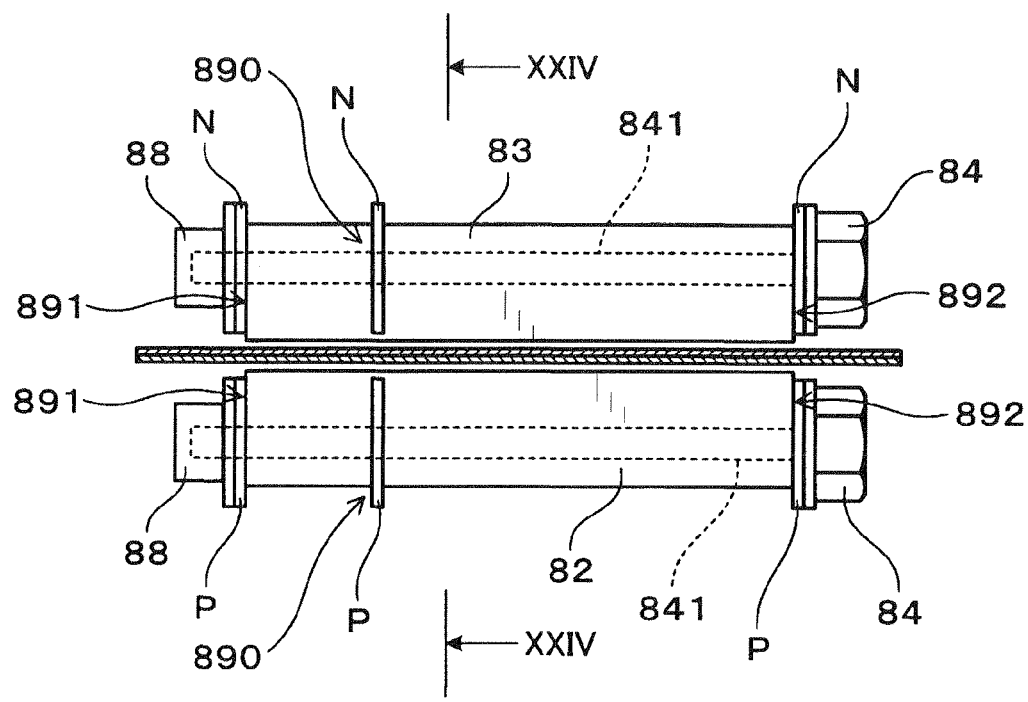
FIG. 23 shows a partial perspective plan view of a bus bar, and is viewed along an arrow XXIII-XXIII of FIG. 24 in the third embodiment.

Further, as shown in FIG. 23, a slit 890 is formed on the bus bar 82 for the positive terminals P.

The positive terminal P is inserted into the slit 890, and the other positive terminals P are overlaid to both end faces 891,892 of the bus bar 82.

Then, using a bolt 84 and nut 88, the plurality of the positive terminals P is fastened to the bus bar 82.

A shaft 841 of the bolt 84 is inserted into bolt insertion holes 280 (refer to FIG. 15) formed in the positive terminals P. The bus bar 83 for the negative terminals N also has the same structure as that of the bus bar 82 for the positive terminals P.

Although not shown, bus bars are connected to the intermediate terminals C. The bus bars for the intermediate terminals C are extended in the Z direction.

More specifically, the bus bars connected to the intermediate terminals C of the first semiconductor module 2a (refer to FIG. 20) constituting the booster circuit 150 are extended in one side (the side opposite to a side where the second semiconductor module 2b and the third semiconductor module 3c are disposed) in the Z direction.

Further, the bus bars connected to the intermediate terminals C of the second semiconductor module 2b and the third semiconductor module 3c constituting the inverter circuit 160 are extended in another side (the side opposite to the side where the first semiconductor module 2a is disposed) in the Z direction.

In addition, the bus bars connected to the intermediate terminals C may be extended in the Y direction.

Further, the intermediate terminals C of the semiconductor modules 2b, 2c constituting the inverter circuit 160 may be connected directly to the connectors without being connected to the bus bars.

Next, functions and effects of the present embodiment are explained.

As shown in FIG. 17 to FIG. 20 in the present embodiment, when viewed from the Z direction, the positive terminals P and the negative terminals N of the plurality of the semiconductor modules 2 respectively overlap each other.

That is, terminals of the same potential are configured to be overlapped in the Z direction.

Therefore, it becomes possible to electrically connect at once the terminals of the same potential (the positive terminals P, the negative terminals N) easily by using the bus bars 82 and 83.

Thus, connecting each of the positive terminals P or the negative terminals N separately to the bus bar, or to the capacitor 4 becomes unnecessary.

Therefore, the connection structure of the positive terminals P and the negative terminals N to the capacitor 4 can be simplified.

Further, in the present embodiment, when viewed from the Z direction, the intermediate terminals C of the two semiconductor modules 2 adjoining in the Z direction are constituted such that they do not overlap each other.

That is, the terminals needed to be electrically connected separately are configured so as not to overlap in the Z direction.

Therefore, spaces between the intermediate terminals C in the Z direction can be prevented from being narrowed.

Therefore, the individual intermediate terminal C can be easily connected to the bus bars or the connectors.

Further, as shown in FIG. 20 in the present embodiment, the plurality of the semiconductor modules 2a to 2c having the same shapes are stacked reversing alternately the front and back surfaces thereof.

Therefore, it becomes possible to reduce the types of the semiconductor modules 2 to be used, and manufacturing cost of the electric power converter 1.

Further, as shown in FIG. 16, the semiconductor module 2 of the present embodiment has three intermediate terminals C, two positive terminals P, and two negative terminals N as the power terminals 200.

Further, the non-projection regions D where no power terminal 200 projects are formed in the side surface 261.

Moreover, the intermediate terminals C and the non-projecting regions D are formed at the positions symmetrical with respect to the center 25.

Further, the two positive terminals P and are the two negative terminals N are formed at positions symmetrical with respect to the center 25.

Therefore, it becomes possible that the positive terminals P and the negative terminals N respectively overlap each other in the Z direction but the intermediate terminals C do not when the two semiconductor module 2 of the same shape with one of them having the front and back surfaces reversed relative to the other one are stacked while forming many power terminals 200 (three intermediate terminals C, two positive terminals P, and two negative terminals N) in the single semiconductor module 2

Further, in the present embodiment, the boost circuit 150 and the inverter circuit 160 are constituted by using the semiconductor module 2a to 2c having the same shape, respectively.

Therefore, it becomes possible to reduce the number of types of the semiconductor modules 2 to be used to one type. Therefore, manufacturing cost of the electric power converter 1 can be easily reduced.

Other features are the same as in the first embodiment.

What is claimed is:

1. An electric power converter comprising:
a stacked body in which a plurality of semiconductor modules having semiconductor elements therein and a plurality of coolers that cool the semiconductor modules are stacked; wherein:
each of the semiconductor modules is provided with a main body that has the semiconductor elements therein, a plurality of power terminals projecting from the main body, and control terminals that are connected electrically to a control circuit;
each of the main bodies overlaps, and among the plurality of the power terminals respectively included in each two semiconductor modules adjoining in a stacking direction of the stacked body, at least parts of roots of the power terminals are configured so as not to overlap each other when viewed from the stacking direction;
each of the main bodies has end surfaces in a direction perpendicular to the stacking direction, and the main bodies are disposed in positions where the end surfaces thereof overlap at the same positions when viewed from the stacking direction; and
among the plurality of the power terminals, terminals of different potential are configured so as not to overlap each other in the stacking direction.

2. The electric power converter according to claim 1, wherein,
the main body is formed in a quadrilateral-plate shape;
the power terminals includes input terminals to which a DC voltage is applied, and output terminals that are electrically connected to AC loads;
the output terminals are projected from an output side surface, which is one of four side surfaces of the main body;
the input terminals are projected from an input side surface, which is the side surface different from the output side surface;
the output terminals are disposed between: (i) a center of the output side surface in a longitudinal direction thereof and (ii) an end portion in the longitudinal direction of the output side surface;
the output terminals are projecting in the same direction from the plurality of the semiconductor modules; and
each of the semiconductor modules is disposed so that the output terminals of the two semiconductor module adjoining in the stacking direction do not overlap each other when viewed from the stacking direction.

3. The electric power converter according to claim 2, wherein,
the plurality of semiconductor modules are formed in the same shape; and
among the two semiconductor modules adjoining in the stacking direction, one of the semiconductor modules is disposed in a state of front and back surfaces thereof being reversed relative to the other semiconductor module.

4. The electric power converter according to claim 2, wherein, the input side surface is parallel to the output side surface, and a smoothing capacitor is disposed on the input side surface.

5. The electric power converter according to claim 4, wherein, the input terminals are disposed between: (i) a center of the input side surface in the longitudinal direction thereof and (ii) an end portion in the longitudinal direction of the input side surface.

6. The electric power converter according to claim 2, wherein, the input terminal is orthogonal to the output terminal, and a smoothing capacitor is disposed on the input side surface.

7. The electric power converter according to claim 2, wherein, the control terminals are projected from the output side surface, and the control terminals are disposed between: (i) a center of the output side surface in the longitudinal direction thereof and (ii) an end portion in the longitudinal direction of the output side surface.

8. The electric power converter according to claim 7, wherein, when viewed from the stacking direction, the output terminals of one of the semiconductor modules among the two semiconductor modules and the control terminals of another one of the two semiconductor modules overlap each other; and the length of the output terminal in a projecting direction is longer than the length of the control terminal in the projecting direction of the output terminals.

9. The electric power converter according to claim 7, wherein, the control circuit is formed on a control circuit board;

through-holes are formed on the control circuit board;

the control circuit board is connected to the control terminals in a state where the output terminals are inserted through the through holes; and a principal surface of the control circuit board is orthogonal to the projecting direction of the output terminals.

10. The electric power converter according to claim 9, wherein, a current sensor for measuring a current flowing through the output terminal is provided to the control circuit board.

11. The electric power converter according to claim 10, wherein, each of the semiconductor modules has three output terminals;

the three output terminals are aligned in the longitudinal direction;

the one of the semiconductor modules has a farthest output terminal which is the most farthest from the center of the output side surface in the longitudinal direction and an adjoining output terminal located next to the farthest output terminal; and the current sensor is attached to at least one of either the farthest output terminal or the adjoining output terminal among the three output terminals.

12. The electric power converter according to claim 1, wherein, the semiconductor elements include upper arm semiconductor elements and lower arm semiconductor elements connected in series to each other;

the power terminals include positive terminals connected to a positive electrode of a capacitor, negative terminals connected to a negative electrode of the capacitor, and intermediate terminals connected between the upper arm semiconductor elements and the lower arm semiconductor elements; and when viewed from the stacking direction of the stacked body, the intermediate terminals of the two semiconductor modules adjoining in the stacking direction do not overlap with each other, and the positive terminals and the negative terminals are respectively overlap each other.

13. The electric power converter according to claim 12, wherein, the plurality of semiconductor modules are formed in the same shape; and among the two semiconductor modules adjoining in the stacking direction, one of the semiconductor modules is disposed in a state of front and back surfaces thereof being reversed relative to the other semiconductor module.

14. The electric power converter according to claim 13, wherein, all of the power terminals are projected from one of the side surfaces of the main body formed in a quadrilateral-plate shape;

the semiconductor module has three intermediate terminals, two positive terminals, and two negative terminals as the power terminals;

three non-projection regions where no power terminal projects are formed in the one of the side surfaces;

the intermediate terminal and the non-projection regions are formed at positions symmetrical with respect to the center in the longitudinal direction of the one of the side surface; and the two positive terminals and the two negative terminal are formed at positions symmetrical with respect to the center.

15. An electric power converter comprising:

a stacked body in which a plurality of semiconductor modules having semiconductor elements therein and a plurality of coolers that cool the semiconductor modules are stacked; wherein:

each of the semiconductor modules is provided with a main body that has the semiconductor elements therein, a plurality of power terminals projecting from the main body, and control terminals that are connected electrically to a control circuit;

each of the main bodies overlaps, and among the plurality of the power terminals respectively included in each two semiconductor modules adjoining in a stacking direction of the stacked body, at least parts of the power terminals are configured so as not to overlap each other when viewed from the stacking direction;

the semiconductor elements include upper arm semiconductor elements and lower arm semiconductor elements connected in series to each other;

the power terminals include positive terminals connected to a positive electrode of a capacitor, negative terminals connected to a negative electrode of the capacitor, and intermediate terminals connected between the upper arm semiconductor elements and the lower arm semiconductor elements; and when viewed from the stacking direction of the stacked body, the intermediate terminals of the two semiconductor modules adjoining in the stacking direction do not overlap with each other, and the positive terminals and the negative terminals are respectively overlap each other.

16. The electric power converter according to claim 15, wherein,
the plurality of semiconductor modules are formed in the same shape; and
among the two semiconductor modules adjoining in the stacking direction, one of the semiconductor modules is disposed in a state of front and back surfaces thereof being reversed relative to the other semiconductor module.

17. The electric power converter according to claim 16, wherein,
all of the power terminals are projected from one of the side surfaces of the main body formed in a quadrilateral-plate shape;
the semiconductor module has three intermediate terminals, two positive terminals, and two negative terminals as the power terminals;
three non-projection regions where no power terminal projects are formed in the one of the side surfaces;
the intermediate terminal and the non-projection regions are formed at positions symmetrical with respect to the center in the longitudinal direction of the one of the side surface; and
the two positive terminals and the two negative terminal are formed at positions symmetrical with respect to the center.

18. An electric power converter comprising:
a stacked body in which a plurality of semiconductor modules having semiconductor elements therein and a plurality of coolers that cool the semiconductor modules are stacked; wherein:
each of the semiconductor modules is provided with a main body that has the semiconductor elements therein, a plurality of power terminals projecting from the main body, and control terminals that are connected electrically to a control circuit;
each of the main bodies overlaps, and among the plurality of the power terminals respectively included in each two semiconductor modules adjoining in a stacking direction of the stacked body, at least parts of roots of the power terminals are configured so as not to overlap each other when viewed from the stacking direction;
each of the main bodies has end surfaces in a direction perpendicular to the stacking direction, and the main bodies are disposed in positions where the end surfaces thereof overlap at the same positions when viewed from the stacking direction;
the main body is formed in a quadrilateral-plate shape;
the power terminals includes input terminals to which a DC voltage is applied, and output terminals that are electrically connected to AC loads;
the output terminals are projected from an output side surface, which is one of four side surfaces of the main body;
the input terminals are projected from an input side surface, which is the side surface different from the output side surface;
the output terminals are disposed between: (i) a center of the output side surface in a longitudinal direction thereof and (ii) an end portion in the longitudinal direction of the output side surface;
the output terminals are projecting in the same direction from the plurality of the semiconductor modules;
each of the semiconductor modules is disposed so that the output terminals of the two semiconductor module adjoining in the stacking direction do not overlap each other when viewed from the stacking direction;
the control terminals are projected from the output side surface,
the control terminals are disposed between: (i) a center of the output side surface in the longitudinal direction thereof and (ii) an end portion in the longitudinal direction of the output side surface;
the control circuit is formed on a control circuit board;
through-holes are formed on the control circuit board;
the control circuit board is connected to the control terminals in a state where the output terminals are inserted through the through holes; and
a principal surface of the control circuit board is orthogonal to the projecting direction of the output terminals.

* * * * *